US007671652B2

(12) United States Patent
Amamiya

(10) Patent No.: US 7,671,652 B2
(45) Date of Patent: Mar. 2, 2010

(54) LOGIC CIRCUIT FOR USE IN A LATCH CIRCUIT AND A DATA READING CIRCUIT OR THE LIKE WHICH INCLUDES SUCH A LATCH CIRCUIT

(75) Inventor: Yasushi Amamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/576,682

(22) PCT Filed: Oct. 4, 2005

(86) PCT No.: PCT/JP2005/018342

§ 371 (c)(1),
(2), (4) Date: Apr. 4, 2007

(87) PCT Pub. No.: WO2006/038612

PCT Pub. Date: Apr. 13, 2006

(65) Prior Publication Data

US 2008/0030234 A1 Feb. 7, 2008

(30) Foreign Application Priority Data

Oct. 5, 2004 (JP) ............................ 2004-292678

(51) Int. Cl.
*H03K 3/00* (2006.01)
(52) U.S. Cl. ...................... 327/218; 327/200; 327/202; 327/214; 327/215

(58) Field of Classification Search .................. 327/218
See application file for complete search history.

(56) References Cited

U.S. PATENT DOCUMENTS

| 4,999,520 A | * | 3/1991 | Usami et al. | .................. 326/18 |
| 6,538,486 B1 | * | 3/2003 | Chen et al. | .................. 327/202 |
| 7,135,894 B1 | * | 11/2006 | Stegers et al. | ............... 327/108 |

FOREIGN PATENT DOCUMENTS

| JP | 63-001212 A | | 1/1988 |
| JP | 63-240117 | * | 5/1988 |
| JP | 63-240117 A | | 10/1988 |
| JP | 05-048402 A | | 2/1993 |
| JP | 05-259830 A | | 10/1993 |
| JP | 09-018312 A | | 1/1997 |

* cited by examiner

*Primary Examiner*—Lincoln Donovan
*Assistant Examiner*—John W Poos
(74) *Attorney, Agent, or Firm*—Sughrue Mion, PLLC

(57) ABSTRACT

A logic circuit is provided with a first differential transistor pair (Q1, Q2) operable in response to a data signal input thereto; a current source for supplying a current to the first differential transistor pair (Q1, Q2); a first transistor (Q5) connected between a common emitter of the first differential transistor pair (Q1, Q2) and the current source, and operable in response to a clock signal input thereto; and a first potential stabilizing circuit (30a) connected to a first junction between the common emitter of the first differential transistor pair (Q1, Q2) and a collector of the first transistor (Q5), for stabilizing a potential at said first junction.

7 Claims, 31 Drawing Sheets

LOGIC CIRCUIT FOR USE IN A LATCH CIRCUIT AND A DATA READING CIRCUIT OR THE LIKE WHICH INCLUDES SUCH A LATCH CIRCUIT

This application claims priority from PCT Application No. PCT/JP2005/018342 filed Oct. 4, 2005, and from Japanese Patent Application No. 2004-292678 filed Oct. 5, 2004, which applications are incorporated herein by reference.

TECHNICAL FIELD

The present invention relates to a logic circuit for use in a latch circuit and a data reading circuit or the like which includes such a latch circuit.

BACKGROUND ART

Latch circuits are used as basic component circuits of logic circuits in many semiconductor integrated circuits. An arrangement of a conventional latch circuit will be described below.

FIG. 1 is a diagram showing an arrangement of a conventional latch circuit. The latch circuit shown in FIG. 1 is used in applications which require high-speed operation. In the description which follows, bipolar transistors are used as active devices.

As shown in FIG. 1, the latch circuit generally employs a differential logic circuit comprising differential transistor pairs (hereinafter simply referred to as "differential pairs") for reading and holding data, a differential transistor pair for being supplied with a clock signal and serving to switch currents supplied to the differential transistor pairs in a higher stage, and a transistor as a constant-current source in a lower stage. The circuit arrangement will hereinafter be described in detail below.

The latch circuit has first differential pair (Q1, Q2) for reading a data signal, second differential pair (Q3, Q4) for holding the data signal, third differential pair (Q5, Q6) connected to common emitter point P1 of the first differential pair and common emitter point P2 of the second differential pair, for being supplied with complementary clock signals, and transistor Q7 serving as a constant-current source.

Reference characters 1a, 1b represent data input terminals to which the data signal is supplied and which are connected to the bases of first differential pair Q1, Q2. Reference characters 2a, 2b represent clock input terminals to which the clock signal is supplied and which are connected to the bases of third differential pair Q5, Q6. Reference characters 3a, 3b represent data output terminals for outputting a data signal, which are connected respectively to collectors of first differential pair Q1, Q2 and respectively collectors of second differential pair Q3, Q4. Data output terminals 3a, 3b are connected respectively to the bases of second differential pair Q3, Q4. Reference character 5 represents a high-potential power supply terminal for being supplied with potential Vcc. The collectors of first differential pair Q1, Q2 are connected to high-potential power supply terminal 5 respectively through resistors R1, R2. Reference character 6 represents a low-potential power supply terminal for being supplied with potential Vee. Transistor Q7 has an emitter connected to low-potential power supply terminal 6.

A master-slave flip-flop circuit employing the latch circuit shown in FIG. 1 will be described below. An example of the master-slave flip-flop circuit is shown in FIG. 4 of JP-A No. H05-48402.

FIG. 2 shows an example of the master-slave flip-flop circuit employing the conventional latch circuit shown in FIG. 1. Those parts of the master-slave flip-flop circuit which are identical to those of the latch circuit shown in FIG. 1 are denoted by identical reference characters.

As shown in FIG. 2, a master circuit has the latch circuit shown in FIG. 1 and transistors Q15, Q16. The collector of transistor Q1 of the first differential pair and the collector of transistor Q3 of the second differential pair are connected to the base of transistor Q15. The collector of transistor Q2 of the first differential pair and the collector of transistor Q4 of the second differential pair are connected to the base of transistor Q16. Transistors Q15, Q16 have respective collectors connected to high-potential power supply terminal 5, and respective emitters connected to low-potential power supply terminal 6 through respective resistors R7, R8. Junction 4a between transistor Q15 and resistor R7 is connected to the base of transistor Q4 of the second differential pair, and junction 4b between transistor Q16 and resistor R8 is connected to the base of transistor Q3 of the second differential pair. Junctions 4a, 4b serve as data output terminals of the master circuit. Transistor Q7 has an emitter connected to low-potential power supply terminal 6 through resistor R3.

A slave circuit is of an arrangement identical to the master circuit. As shown in FIG. 2, the slave circuit has fourth differential pair (Q8, Q9) for reading a data signal, fifth differential pair (Q10, Q11) for holding the data signal, sixth differential pair (Q12, Q13) connected to common emitter point P3 of the fourth differential pair and common emitter point P4 of the fifth differential pair, for being supplied with complementary clock signals, transistor Q14 serving as a constant-current source, and transistors Q17, Q18.

The collector of transistor Q8 of the fourth differential pair and the collector of transistor Q10 of the fifth differential pair are connected to the base of transistor Q17. The collector of transistor Q9 of the fourth differential pair and the collector of transistor Q11 of the fifth differential pair are connected to the base of transistor Q18. Transistors Q17, Q18 have respective collectors connected to high-potential power supply terminal 5, and respective emitters connected to low-potential power supply terminal 6 through respective resistors R9, R10.

A junction between transistor Q17 and resistor R9 and a junction between transistor Q18 and resistor R10 are connected respectively to data output terminals 3a, 3b of the slave circuit. Data output terminals 3a, 3b are connected to the respective bases of transistors Q10, Q11 of the fifth differential pair. Junctions 4a, 4b of the master circuit serve as data input terminals of the slave circuit and are connected to the respective bases of transistors Q8, Q9 of the fourth differential pair. Data output terminals 3a, 3b and data output terminals 4a, 4b serve as the output terminals of flip-flop circuit sections.

Operation of the master-slave flip-flop is the same operation of the conventional master-slave flip-flop and will not be described below.

DISCLOSURE OF THE INVENTION

The results of a simulation of the above flip-flop circuit will be described below. FIG. 3 is a graph showing an output waveform calculated by a simulator which are output at points 4a, 4b when an input data signal of 40 Gbps is supplied to data input terminals 1a, 1b and a clock signal of 40 GHz is supplied to clock input terminals 2a, 2b. As shown in FIG. 3, the input data signal is retimed by the clock signal in the flip-flop circuit and is output. The output data waveform suffers a distortion (hereinafter referred to as "clock signal interference") in synchronism with the clock signal.

FIG. 4 shows potential variations at common emitter points P1, P2, P3, P4 of differential pairs (Q1, Q2), (Q3, Q4), (Q8, Q9), (Q10, Q11) of a data signal processor upon operation of the flip-flop circuit shown in FIG. 2. The vertical axis represents varying potentials and the horizontal axis represents time. The varying potentials at common emitter points P2, P3 are essentially equal to each other, and are indicated by the solid-line curve. The varying potential at common emitter point P1 is indicated by the dot-and-dash-line curve, and the varying potential at common emitter point P4 by the two-dot-and-dash-line curve.

As shown in FIG. 4, at each common emitter point, the potential variation range exceeds 0.1 V, causing a large distortion. When there is a large variation in synchronism with the clock signal, it is considered that the variation is superposed as noise on an input potential applied to a differential pair, causing the output waveform to suffer a distortion in synchronism with the clock signal. If the clock signal interference increases, high and low levels of the data signal are not determined properly, and an error tends to be produced in the output data.

The present invention has been made in order to solve the problems of the conventional art described above. It is an object of the present invention to provide a high-speed logic circuit for suppressing a waveform distortion due to a clock signal interference and improving an error rate.

To accomplish the above object, a logic circuit according to the present invention has a first differential transistor pair operable in response to a data signal input thereto, a current source for supplying a current to the first differential transistor pair, a first transistor connected between a common emitter of the first differential transistor pair and the current source, and operable in response to a clock signal input thereto, and a first potential stabilizing circuit connected to a first junction between the common emitter of the first differential transistor pair and a collector of the first transistor, for stabilizing a potential at the first junction.

Since the potential stabilizing circuit is connected between the first differential transistor pair and the first transistor, when the first transistor operates in response to the clock signal to supply a current to the common emitter of the first differential transistor pair, a distortion in synchronism with the clock signal is prevented from occurring at the common emitter.

The logic circuit according to the present invention stabilizes the potential at the common emitter of the differential transistor pair which processes the data signal. Thus, there is provided a high-speed logic circuit with an improved error rate for suppressing a distortion (clock signal interference) of the output waveform which is produced in synchronism with the clock signal.

BEST MODE FOR CARRYING OUT THE INVENTION

A logic circuit according to the present invention is characterized by potential stabilizing circuits connected to common emitters of differential transistor pairs.

1st Embodiment

Figure 5:
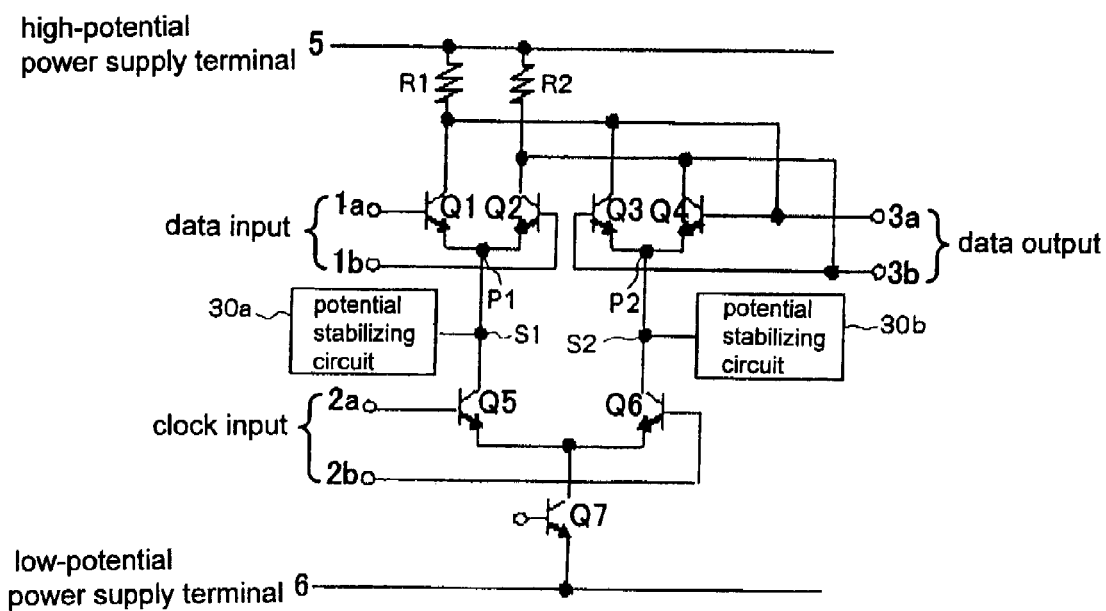
FIG. 5 is a circuit diagram of a latch circuit according to a first embodiment.

An arrangement of a latch circuit according to the present embodiment will be described below. FIG. 5 is a circuit diagram of the latch circuit according to the present embodiment. Those parts of the latch circuit which are identical to those of the latch circuit shown in FIG. 1 are denoted by identical reference characters, and will not be described in detail below.

Figure 1:
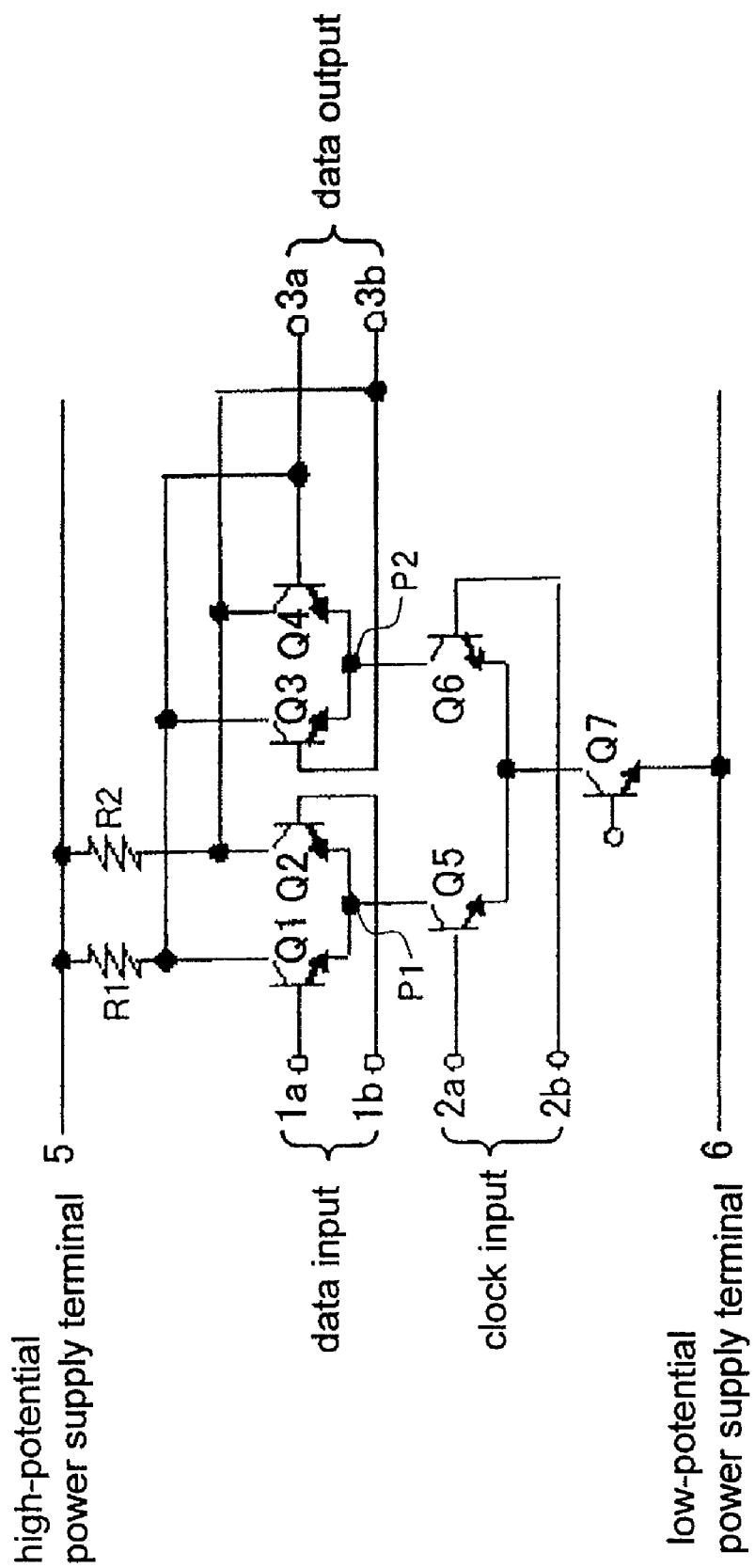
FIG. 1 is a circuit diagram of a conventional latch circuit.

As shown in FIG. 5, the latch circuit according to the present embodiment has potential stabilizing circuits 30a, 30b connected respectively to junction S1 between common emitter point P1 of the first differential pair and the third differential pair and junction S2 between common emitter point P2 of the second differential pair and the third differential pair in the arrangement shown in FIG. 1.

Figure 4:
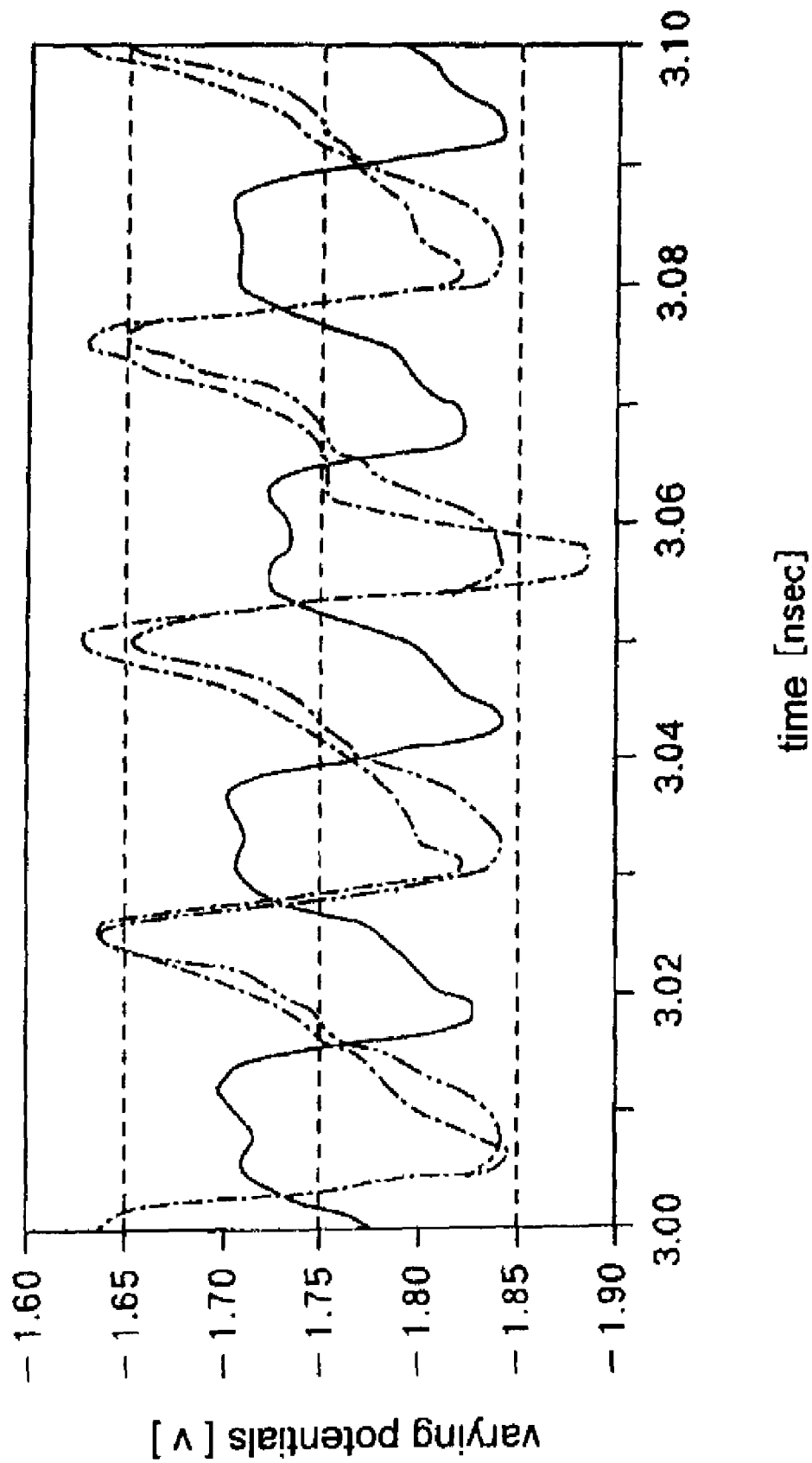
FIG. 4 shows an example of calculated potential variations at common emitter points of data processing differential pairs of the conventional flip-flop circuit.

For solving the problems, attention is paid to the potentials at the common emitter points of the differential pairs of the data signal processor as a cause of a clock signal interference. Since each of common emitter points P1 through P4 is the output terminal (collector point) of a transistor for inputting a clock signal, the potential varies in synchronism with an input collector signal. In each of the differential pair transistors of the data signal processor, the difference between the multiplied level of the data signal applied to the base point thereof and the potential at the common emitter point of the difference pair corresponds to the input potential, and the amount of collector current of the transistor is determined depending on the magnitude of the input potential. The value produced by multiplying the collector current by the load resistance represents the potential level of the output signal. Therefore, if the potentials at common emitter points P1 through P4 vary greatly in synchronism with the clock signal shown in FIG. 4, then the variation is superposed as noise on the input potentials applied to the differential pairs, causing the output waveform to suffer a distortion in synchronism with the clock signal.

With the latch circuit according to the present invention, potential variations at the common emitter points P1, P2 which are caused in synchronism with the clock signal are reduced by potential stabilizing circuits 30a, 30b. As a result, noise caused by the clock signal is prevented from being superposed on the input potentials supplied to the first differential pair and the second differential pair, making it possible for the latch circuit to produce an output waveform free of a clock signal interference.

The circuit shown in FIG. 5 may be a logic circuit having first differential pair (Q1, Q2), transistor Q5 connected to a current source, and potential stabilizing circuit 30a. This circuit arrangement is also effective to prevent a clock signal interference from increasing potential variations at common emitter point P1.

Figure 2:
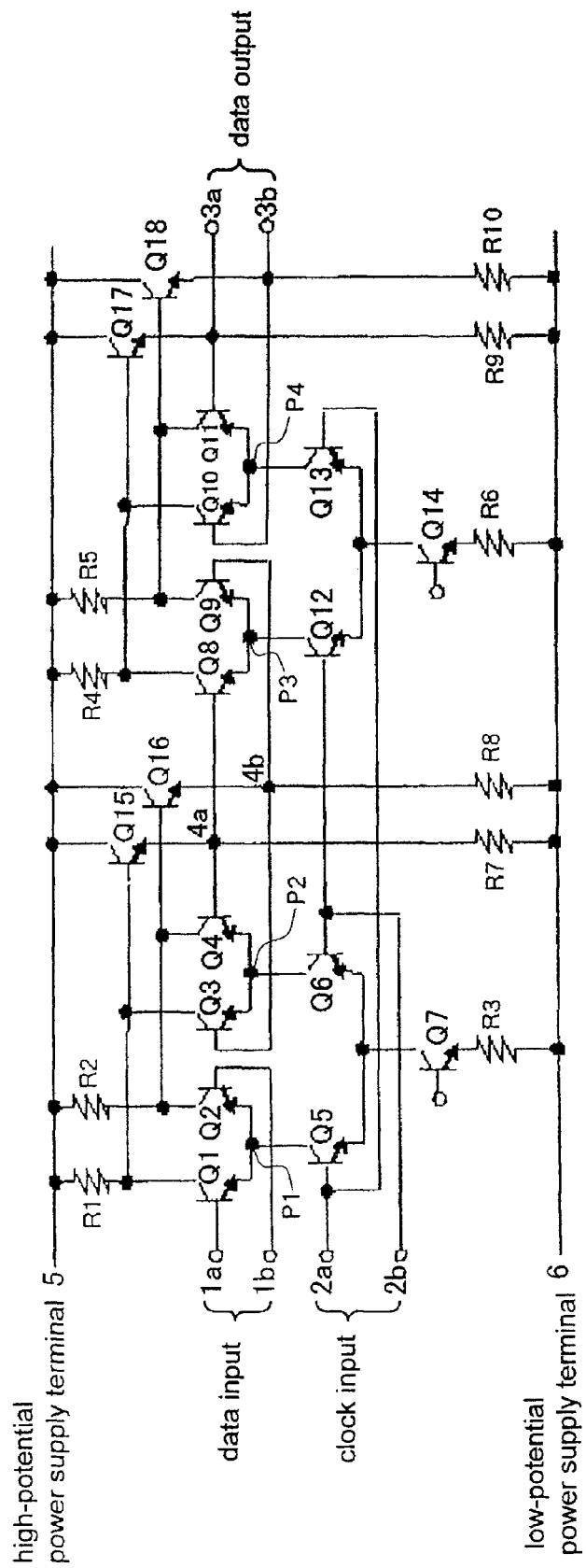
FIG. 2 is a circuit diagram of a conventional flip-flop circuit.
Figure 6:
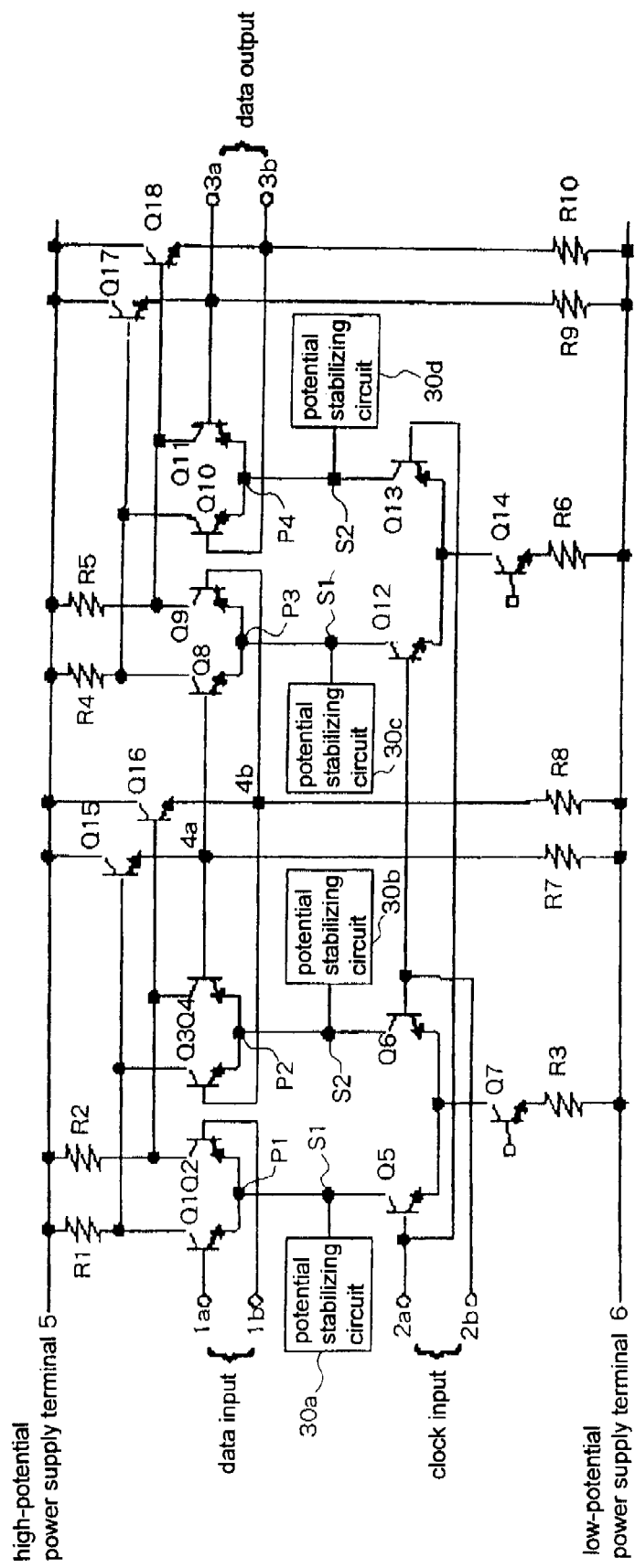
FIG. 6 is a circuit diagram of a flip-flop circuit according to the first embodiment.

The present invention is not limited to the latch circuit shown in FIG. 5. A specific example of the present invention will be described below. The present invention may be directed to a functional circuit such as a flip-flop circuit employing the latch circuit shown in FIG. 5. FIG. 6 is a circuit diagram of a master-slave flip-flop circuit employing the latch circuit according to the present embodiment, Those parts of the master-slave flip-flop circuit which are identical to those of the conventional flip-flop circuit shown in FIG. 2 are denoted by identical reference characters, and will not be described in detail below.

As shown in FIG. 6, as with the latch circuit shown in FIG. 5, a master circuit has potential stabilizing circuits 30a, 30b connected respectively to junction S1 between common emitter point P1 of the first differential pair and the third differential pair and junction S2 between common emitter point P2 of the second differential pair and the third differential pair.

A slave circuit has potential stabilizing circuits 30c, 30d connected respectively to junction S3 between common emitter point P3 of the fourth differential pair and the sixth differential pair and junction S4 between common emitter point P4 of the fifth differential pair and the sixth differential pair.

As with the latch circuit shown in FIG. 5, the flip-flop circuit shown in FIG. 6 is capable of preventing noise caused by the clock signal from being superposed on the input potentials supplied to the first differential pair and the second differential pair. Because potential variations at points P3, P4 which are caused in synchronism with the clock signal are reduced by potential stabilizing circuits 30a, 30b, noise caused by the clock signal is prevented from being superposed on the input potentials supplied to the fourth differential pair and the fifth differential pair, making it possible for the flip-flop circuit to produce an output waveform free of a clock signal interference.

Figure 7:
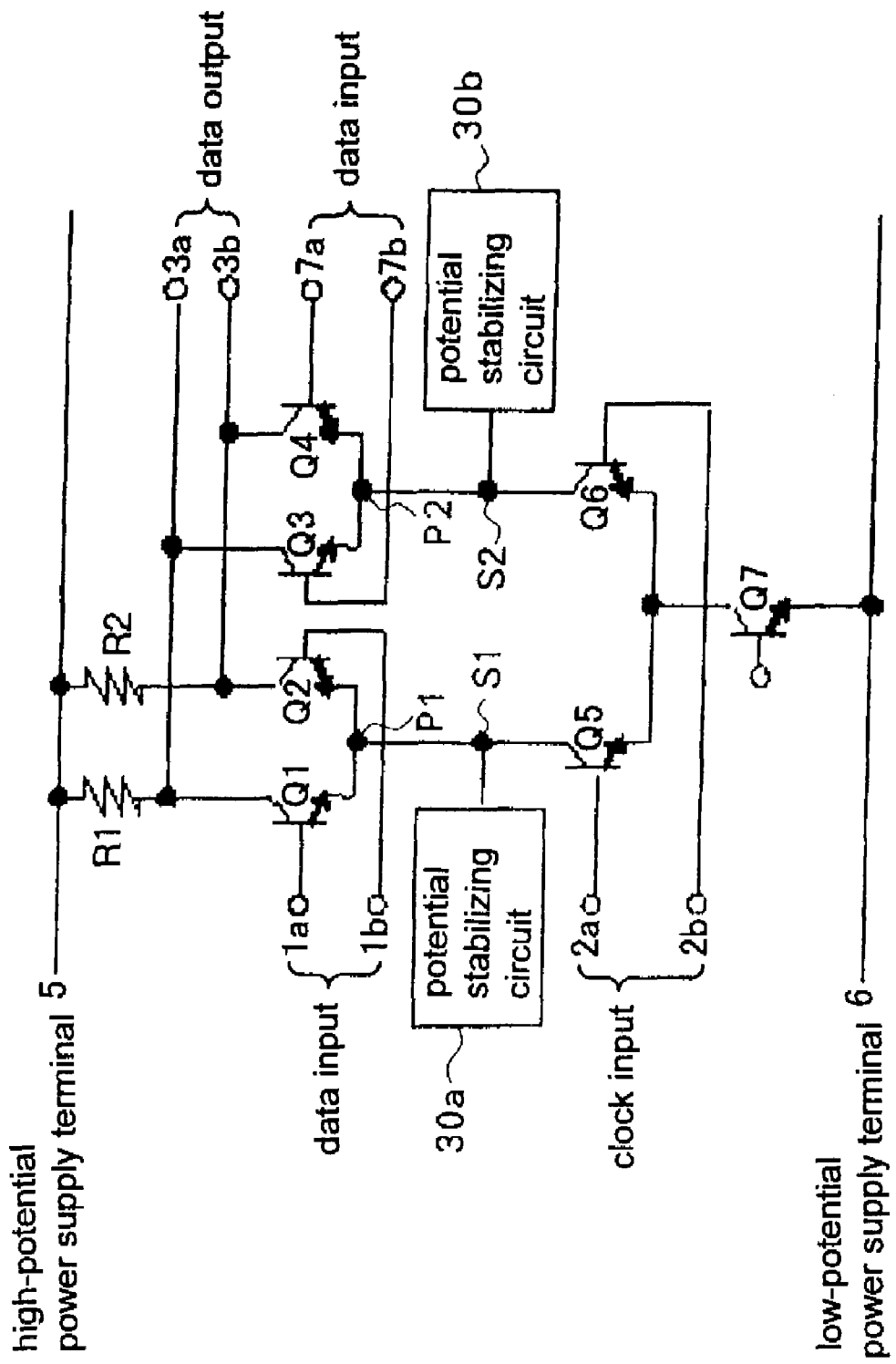
FIG. 7 is a circuit diagram of a selector circuit according to the first embodiment.

An arrangement wherein the latch circuit shown in FIG. 5 is employed as a selector circuit will be described below. FIG. 7 is a diagram showing a selector circuit employing the latch circuit according to the present embodiment. Those parts of the selector circuit which are identical to those of the latch circuit shown in FIG. 5 are denoted by identical reference characters, and will not be described in detail below.

As shown in FIG. 7, the latch circuit shown in FIG. 5 is employed as a data reading circuit of the selector circuit. As with the latch circuit shown in FIG. 5, the selector circuit has potential stabilizing circuits 30a, 30b connected respectively to junction S1 between common emitter point P1 of the first differential pair and the third differential pair and junction S2 between common emitter point P2 of the second differential pair and the third differential pair.

Because potential variations at common emitter points P1, P2 which are caused in synchronism with the clock signal are reduced by potential stabilizing circuits 30a, 30b, noise caused by the clock signal is prevented from being superposed on the input potentials supplied to the fourth differential pair and the fifth differential pair, making it possible for the selector circuit to produce an output waveform free of a clock signal interference.

2nd Embodiment

Figure 8:
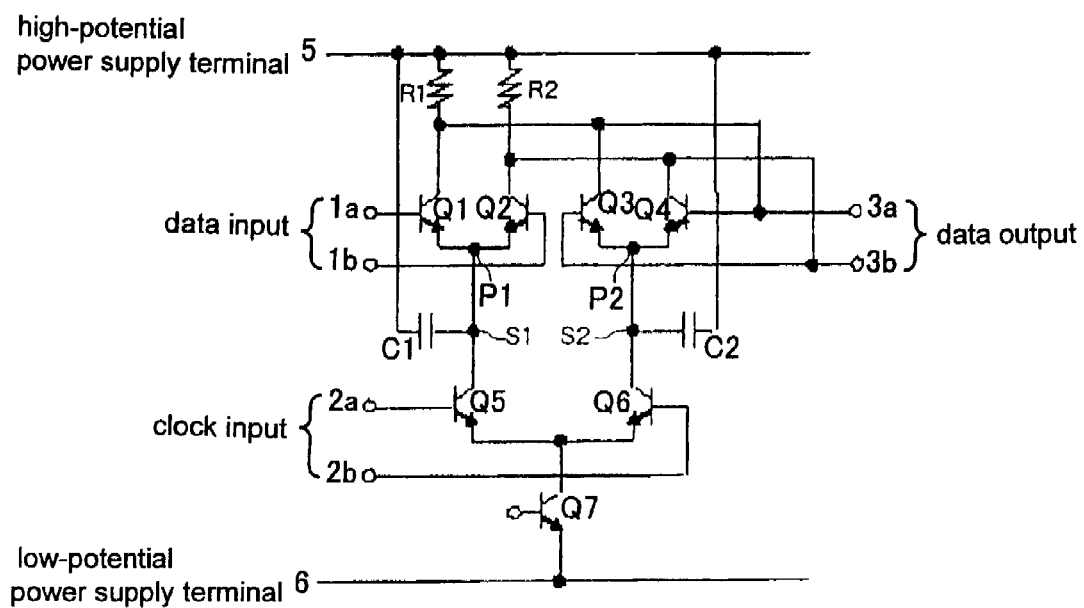
FIG. 8 is a circuit diagram of a latch circuit according to a second embodiment.

A latch circuit according to the present embodiment employs capacitors as potential stabilizing circuits. The latch circuit according to the present embodiment will be described below. FIG. 8 is a diagram showing an arrangement of the latch circuit according to the present embodiment. Those parts of the latch circuit which are identical to those of the latch circuit shown in FIG. 5 are denoted by identical reference characters, and will not be described in detail below.

In FIG. 8, capacitor C1 is connected between high-potential power supply terminal 5 and junction S1 and capacitor C2 is connected between high-potential power supply terminal 5 and junction S2, as the potential stabilizing circuits shown in FIG. 5.

Figure 9:
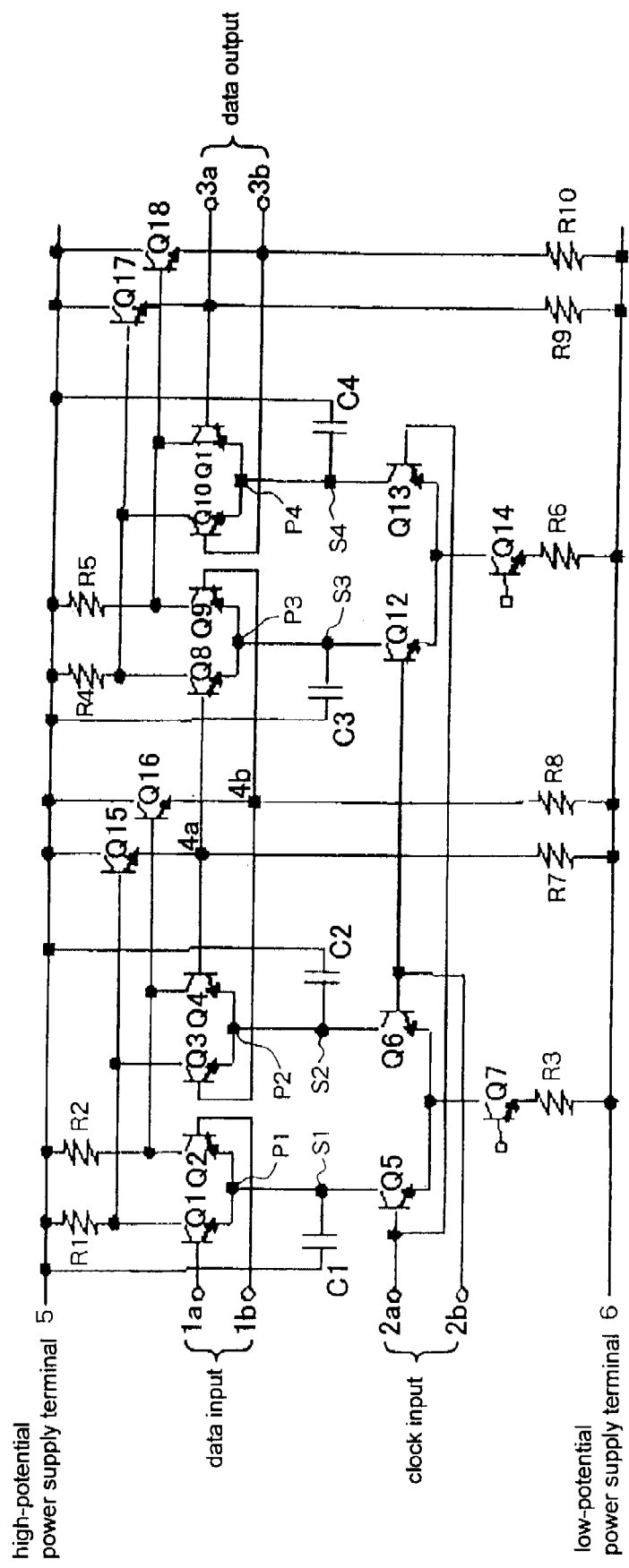
FIG. 9 is a circuit diagram of a flip-flop circuit according to the second embodiment.

A master-slave flip-flop circuit employing the latch circuit shown in FIG. 8 will be described below. FIG. 9 is a diagram showing an example of a flip-flop circuit employing the latch circuit shown in FIG. 8. Those parts of the flip-flop circuit which are identical to those of the flip-flop circuit shown in FIG. 6 are denoted by identical reference characters, and will not be described in detail below.

As with the latch circuit shown FIG. 8, a master circuit has capacitor C1 connected between high-potential power supply terminal 5 and junction S1 and capacitor C2 connected between high-potential power supply terminal 5 and junction S2. A slave circuit has capacitor C3 connected between high-potential power supply terminal 5 and junction S3 and capacitor C4 connected between high-potential power supply terminal 5 and junction S4.

Figure 3:
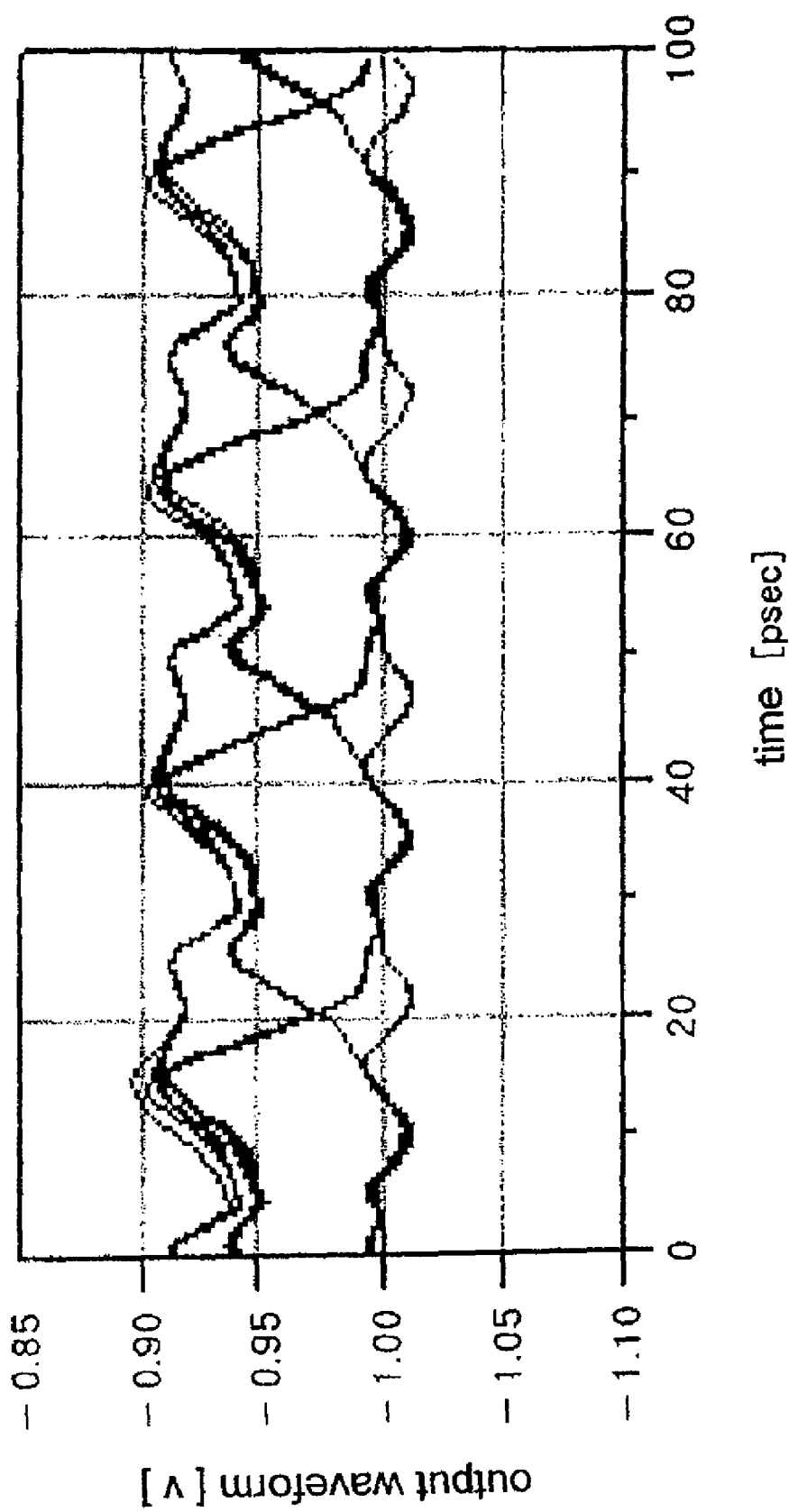
FIG. 3 shows an example of a calculated output waveform of the conventional flip-flop circuit.
Figure 10:
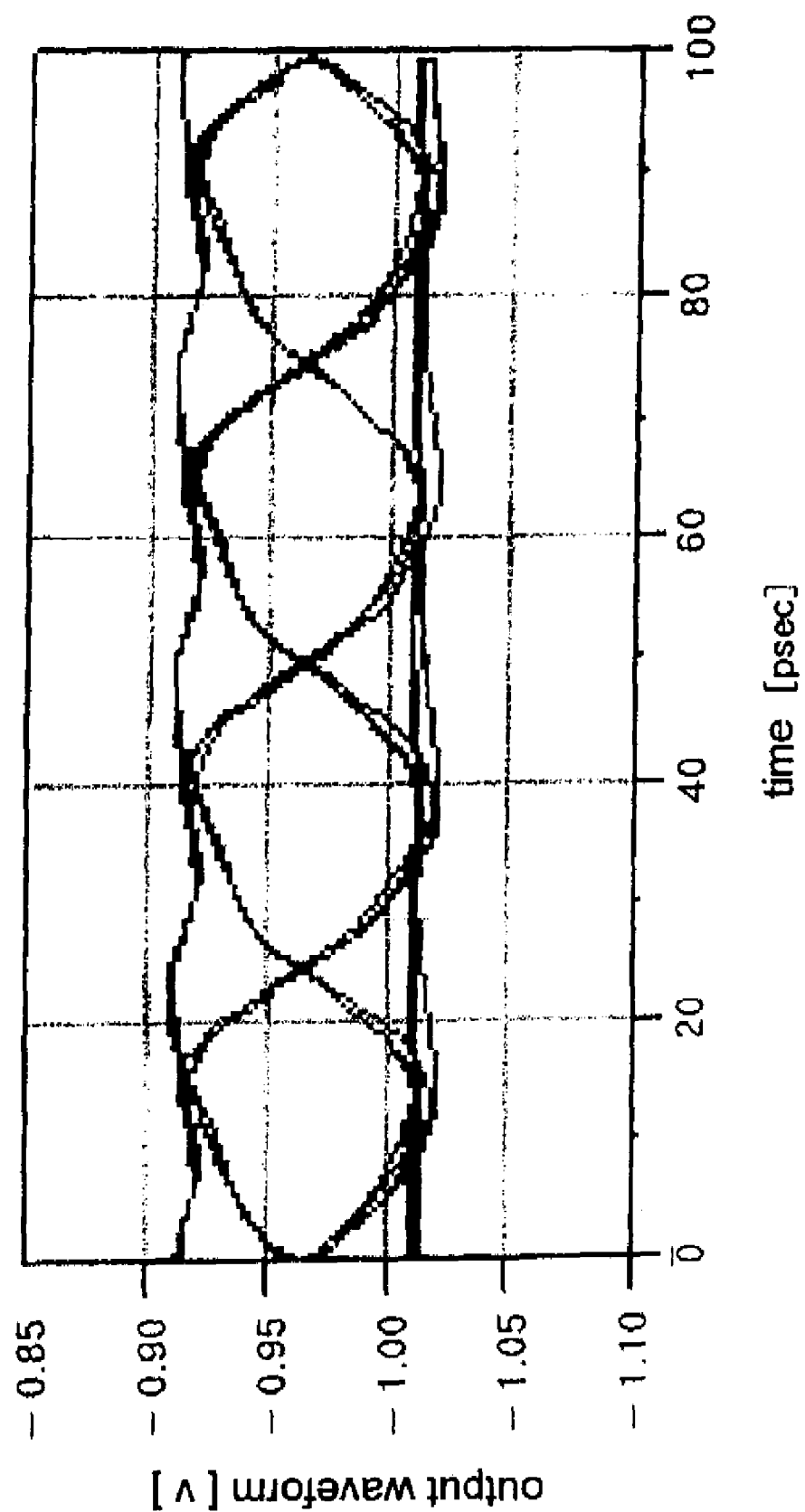
FIG. 10 shows an example of a calculated output waveform of the flip-flop circuit according to the second embodiment.

The results of a simulation of the flip-flop circuit shown in FIG. 9 will be described below. FIG. 10 is a graph showing an output waveform calculated by a simulator which is output at junctions 4a, 4b when a data signal of 40 Gbps is supplied to data input terminals 1a, 1b and a clock signal of 40 GHz is supplied to clock input terminals 2a, 2b. The output data waveform shown in FIG. 10 suffers a less distortion than the waveform shown in FIG. 3.

Figure 11:
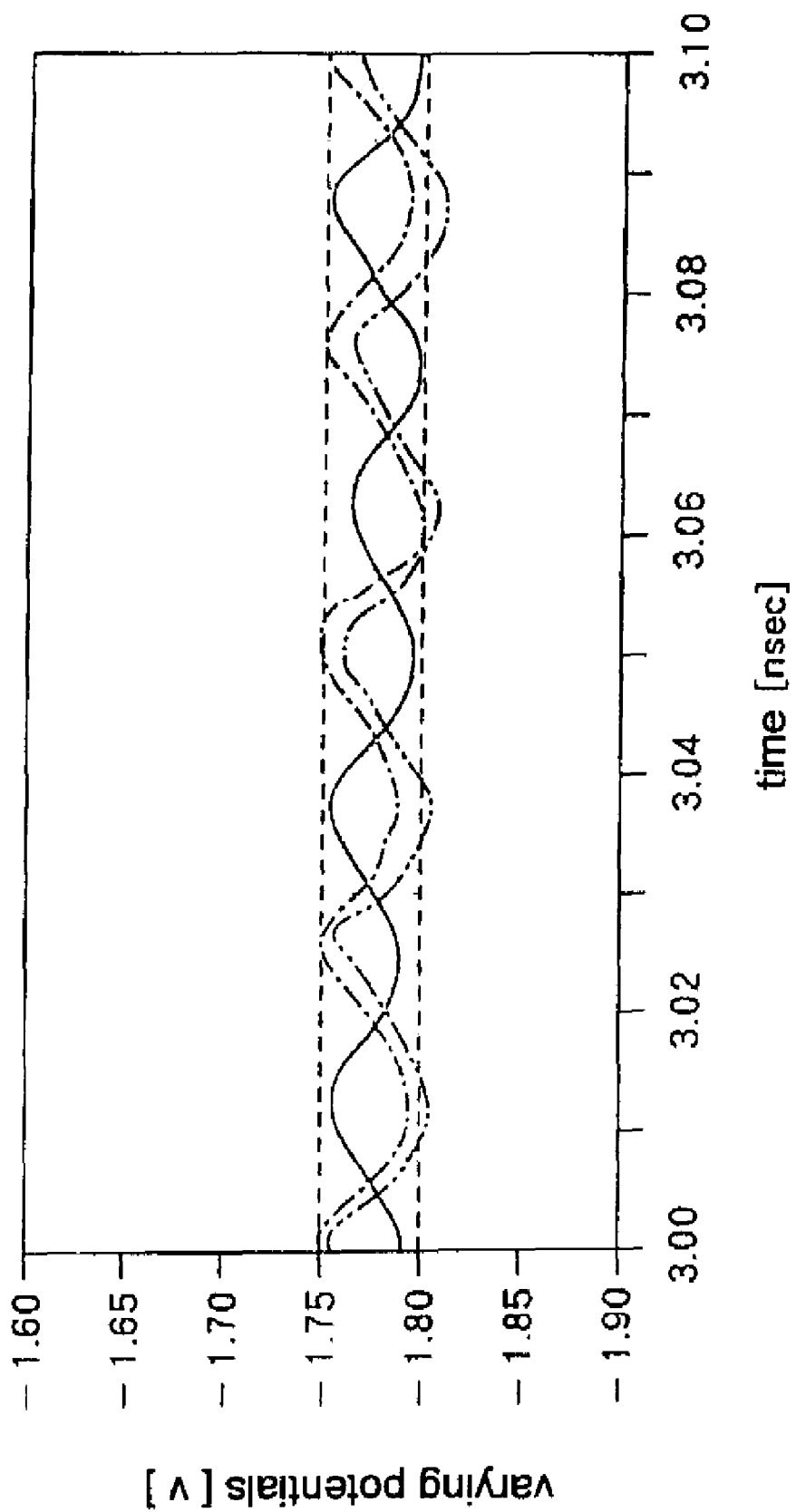
FIG. 11 shows an example of calculated potential variations at common emitter points of data processing differential pairs of the flip-flop circuit according to the second embodiment.

FIG. 11 shows potential variations at common emitter points P1, P2, P3, P4. The vertical axis represents varying potentials and the horizontal axis represents time. The varying potentials at common emitter points P2, P3 are indicated by the solid-line curve. The varying potential at common emitter point P1 is indicated by the dot-and-dash-line curve, and the varying potential at common emitter point P4 by the two-dot-and-dash-line curve. As shown in FIG. 11, at each common emitter point, the potential variation range falls between −1.75 V and −1.80 V. The potential variation shown in FIG. 11 has its range smaller than the potential variation shown in FIG. 4, and the potential variation ranges between the junctions are uniform.

The flip-flop circuit according to the present invention provides stabler potentials at common emitter points P1, P2, P3, P4 than the conventional flip-flop circuit, with the result that a clock signal interference with the data output waveform is reduced.

The capacitor C used in the above potential stabilizing circuit will be described below. The insertion of the potential stabilizing circuits according to the embodiment of the present invention means the addition of low-pass filters to paths of a switching control signal synchronous with the clock signal transmitted from differential pairs (Q5, Q6), (Q12, Q13) to data processing differential pairs (Q1, Q2), (Q3, Q4), (Q8, Q9), (Q10, Q11). The low-pass filters cut off part of an excessive clock signal transmitted to the data processing differential pairs, thereby improving the data output waveform. Therefore, the value of the capacitor C as the potential stabilizing circuit should desirably be selected such that the time constant of the low-pass filter is close to the clock signal frequency fc.

If it is assumed that the output resistance (collector resistance) of a differential pair for inputting a clock signal is represented by Rc, and the collector-to-ground capacitance by Cc, then $2\pi fc \sim 1/((C+Cc) \cdot Rc)$. Therefore, the capacitance $C_0$ as the potential stabilizing circuit should desirably be close to:

$$C_0 = 1/(2\pi fc \cdot Rc) - Cc$$

If the capacitance is excessively smaller than $C_0$, then the low-pass filters do not cut off the clock signal at all, and are not effective to reduce a clock signal interference with the data output waveform. If the capacitance is excessively greater than $C_0$, then the low-pass filters fully cut off the clock signal, and no switching is performed to supply currents to the data differential pair in synchronism with the clock signal, so that the latch circuit will not function. The capacitance C for providing the advantages of the present invention should desirably be in the range of $0.1 \cdot C_0 < C < 10 \cdot C_0$.

In the above description of the potential stabilizing circuits including the capacitors, terminals of the capacitors are connected to respective junctions S1, S2, S3, S4 and the other terminals to high-potential power supply terminal 5. However, the other terminals are not limited to being connected to high-potential power supply terminal 5, but may be stable (grounded) at high frequencies, e.g., may be connected to ground (ground potential) or low-potential power supply terminal 6 shown in FIG. 8.

The arrangements of the present embodiment are not limited to the latch circuit shown in FIG. 8 and the master-slave flip-flop circuit shown in FIG. 9. The present invention as applied to a clocked inverter flip-flop circuit will be described below.

Figure 12:
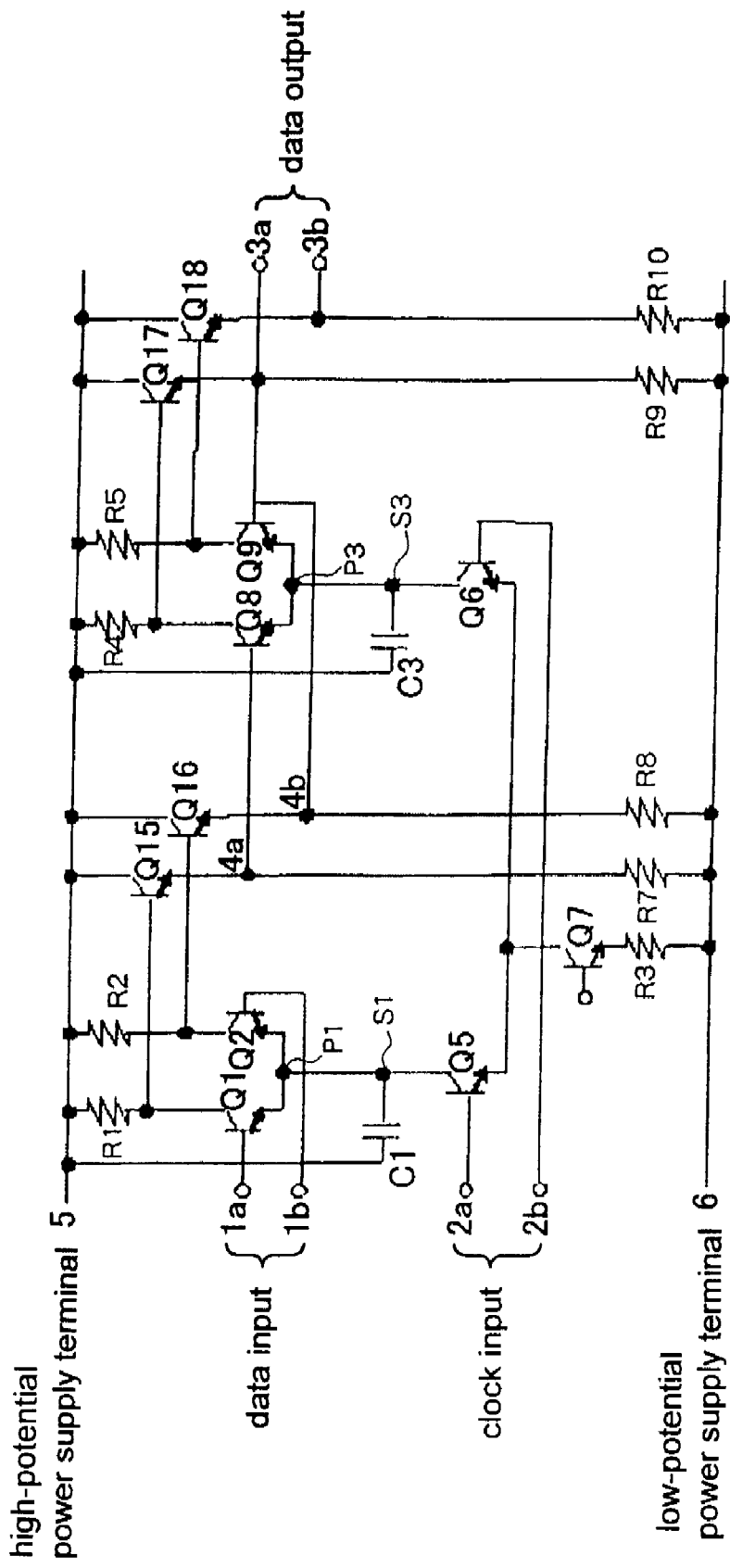
FIG. 12 is a circuit diagram of a clocked inverter flip-flop circuit according to the second embodiment.

FIG. 12 shows a clocked inverter flip-flop circuit. Those parts of the clocked inverter flip-flop circuit which are identical to those of the flip-flop circuit shown in FIG. 9 are denoted by identical reference characters, and will not be described in detail below.

The clocked inverter flip-flop circuit is of such an arrangement that the second differential pair, the fifth differential pair, and the sixth differential pair are removed from the flip-flop circuit shown in FIG. 9, and the third differential pair is connected to the first differential pair and the fourth differential pair. As shown in FIG. 12, capacitor C1 has a terminal connected to junction S1 between common emitter point P1 of the first differential pair and the third differential pair. Capacitor C3 has a terminal connected to junction S3 between common emitter point P3 of the fourth differential pair and the third differential pair. The other terminals of capacitors C1, C3 are connected to high-potential power supply terminal 5.

Figure 13:
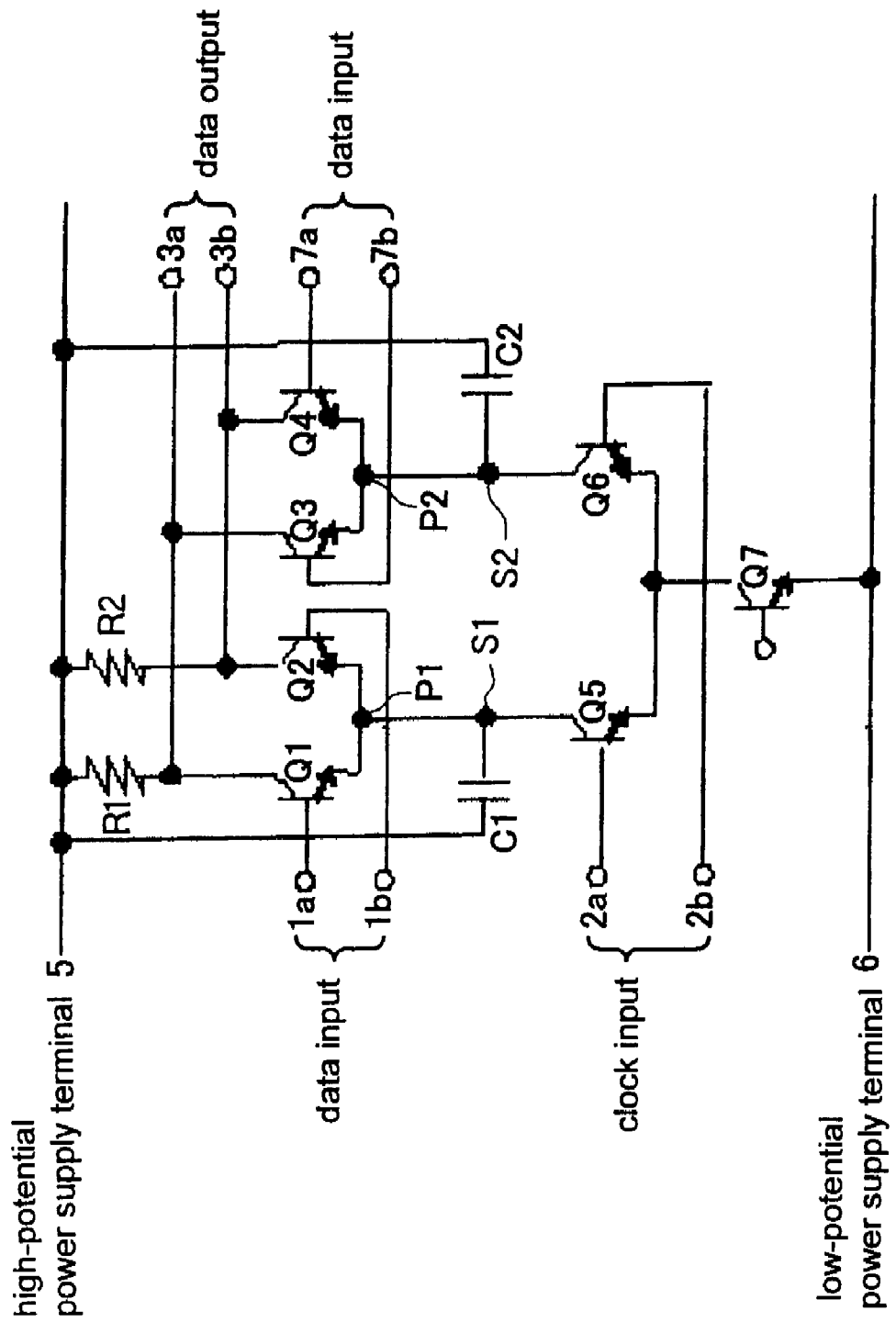
FIG. 13 is a circuit diagram of a selector circuit according to the second embodiment.

A selector circuit wherein the latch circuit shown in FIG. 8 is employed as a data reading circuit will be described below. FIG. 13 shows a selector circuit employing a data reading circuit which provides the latch circuit shown in FIG. 8.

The selector circuit shown in FIG. 13 has capacitors C1, C2 as the potential stabilizing circuits of the selector circuit shown in FIG. 7. Capacitor C1 has a terminal connected to junction S1 between common emitter point P1 of the first differential pair and the third differential pair and the other terminal to high-potential power supply terminal 5. Capacitor C2 has a terminal connected to junction S2 between common emitter point P2 of the second differential pair and the third differential pair, and the other terminal to high-potential power supply terminal 5.

As described above, the latch circuit shown in FIG. 8 may be applied to a wide range of logic circuits including a flip-flop circuit and a selector circuit.

3rd Embodiment

Figure 14:
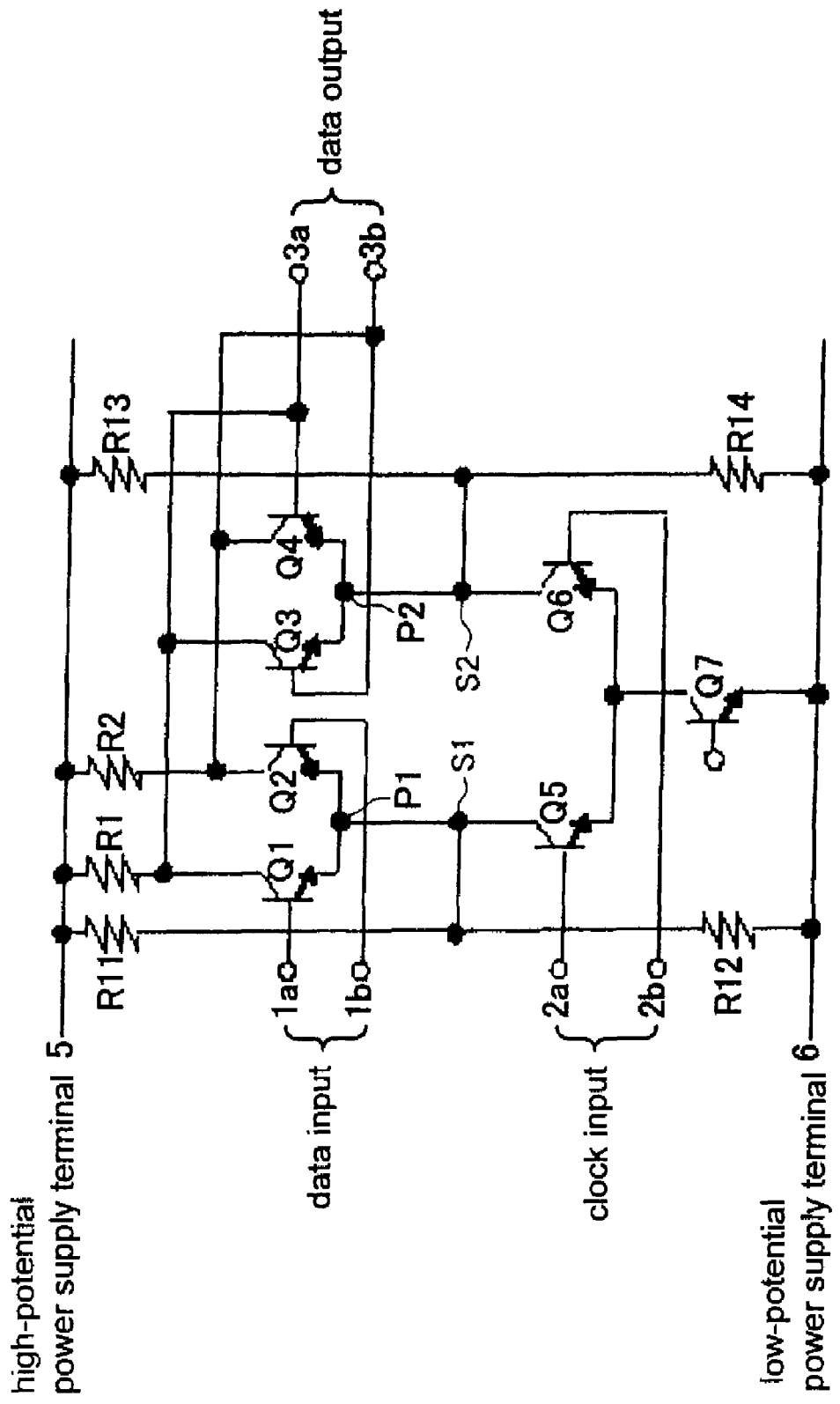
FIG. 14 is a circuit diagram of a latch circuit according to a third embodiment.

A latch circuit according to the present embodiment employs resistance dividing circuits as potential stabilizing circuits. The latch circuit according to the present embodiment will be described below. FIG. 14 is a diagram showing an arrangement of the latch circuit according to the present embodiment. Those parts of the latch circuit which are identical to those of the latch circuit shown in FIG. 5 are denoted by identical reference characters, and will not be described in detail below.

The latch circuit shown in FIG. 14 has resistance dividing circuits as the potential stabilizing circuits shown in FIG. 5. Junction S1 between common emitter point P1 of the first differential pair and the third differential pair is connected to high-potential power supply terminal 5 through resistor R11 and also to low-potential power supply terminal 6 through resistor R12. Junction S2 between common emitter point P2 of the second differential pair and the third differential pair is connected to high-potential power supply terminal 5 through resistor R13 and also to low-potential power supply terminal 6 through resistor R14. The resistance dividing circuits have resistance values determined to develop desired potentials at junctions S1, S2. The potential applied to high-potential power supply terminal 5 may be a stable reference potential, and is not limited to a power supply potential.

Figure 15:
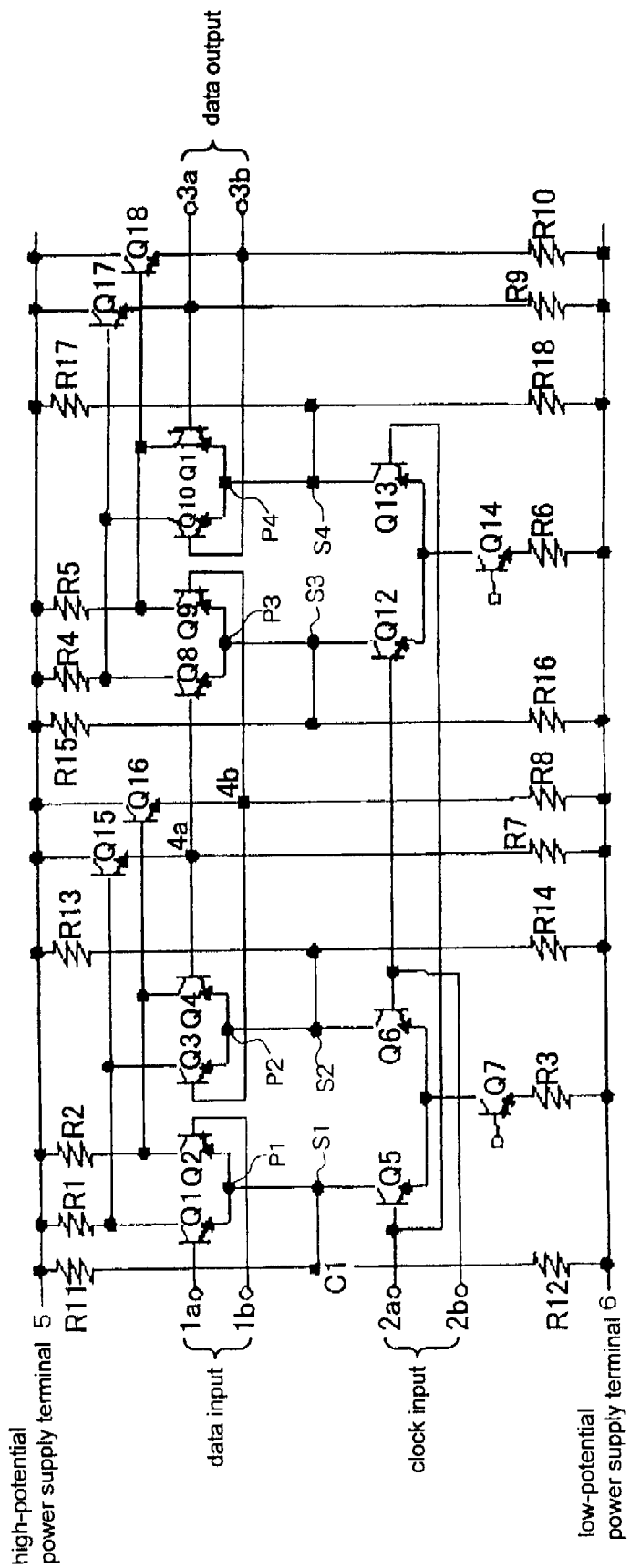
FIG. 15 is a circuit diagram of a flip-flop circuit according to the third embodiment.

A master-slave flip-flop circuit employing the latch circuit shown in FIG. 14 will be described below. FIG. 15 is a diagram showing an example of a flip-flop circuit employing the latch circuit shown in FIG. 14. Those parts of the flip-flop circuit which are identical to those of the flip-flop circuit shown in FIG. 6 are denoted by identical reference characters, and will not be described in detail below.

As with the latch circuit shown in FIG. 14, in a master circuit, resistors R11, R12 which are connected in series with each other between high-potential power supply terminal 5 and low-potential power supply terminal 6 are divided from each other by junction S1, and resistors R13, R14 which are connected in series with each other between high-potential power supply terminal 5 and low-potential power supply terminal 6 are divided from each other by junction S2. In slave circuit, resistors R15, R16 which are connected in series with each other between high-potential power supply terminal 5 and low-potential power supply terminal 6 are divided from each other by junction S3, and resistors R17, R18 which are connected in series with each other between high-potential power supply terminal 5 and low-potential power supply terminal 6 are divided from each other by junction S4.

Figure 16:
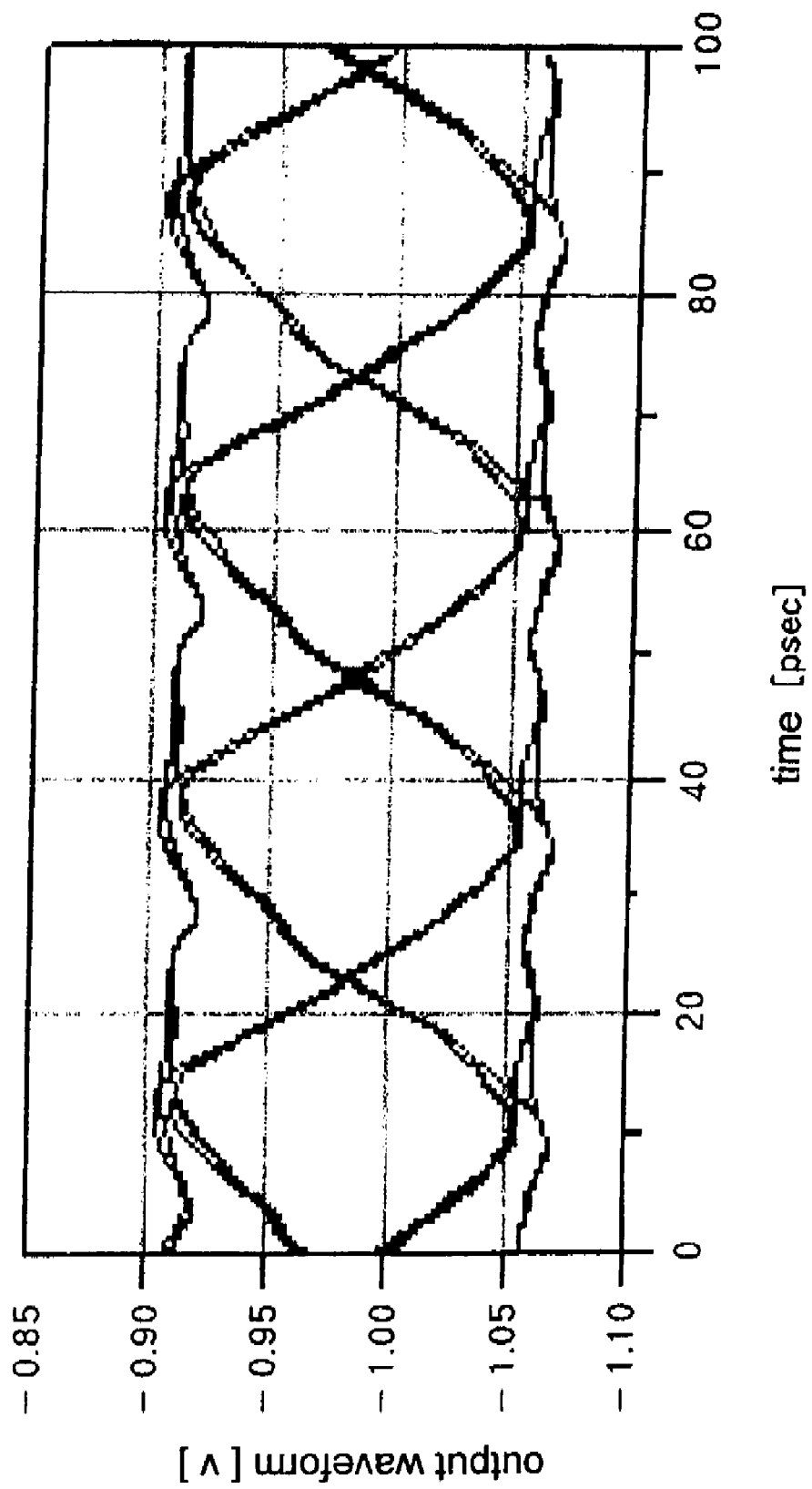
FIG. 16 shows an example of a calculated output waveform of the flip-flop circuit according to the third embodiment.

The results of a simulation of the flip-flop circuit shown in FIG. 15 will be described below. FIG. 16 is a graph showing an output waveform calculated by a simulator which is output at points 4a, 4b when a data signal of 40 Gbps is supplied to data input terminals 1a, 1b and a clock signal of 40 GHz is supplied to clock input terminals 2a, 2b. The output data waveform shown in FIG. 16 suffers a less distortion than the waveform shown in FIG. 3.

Figure 17:
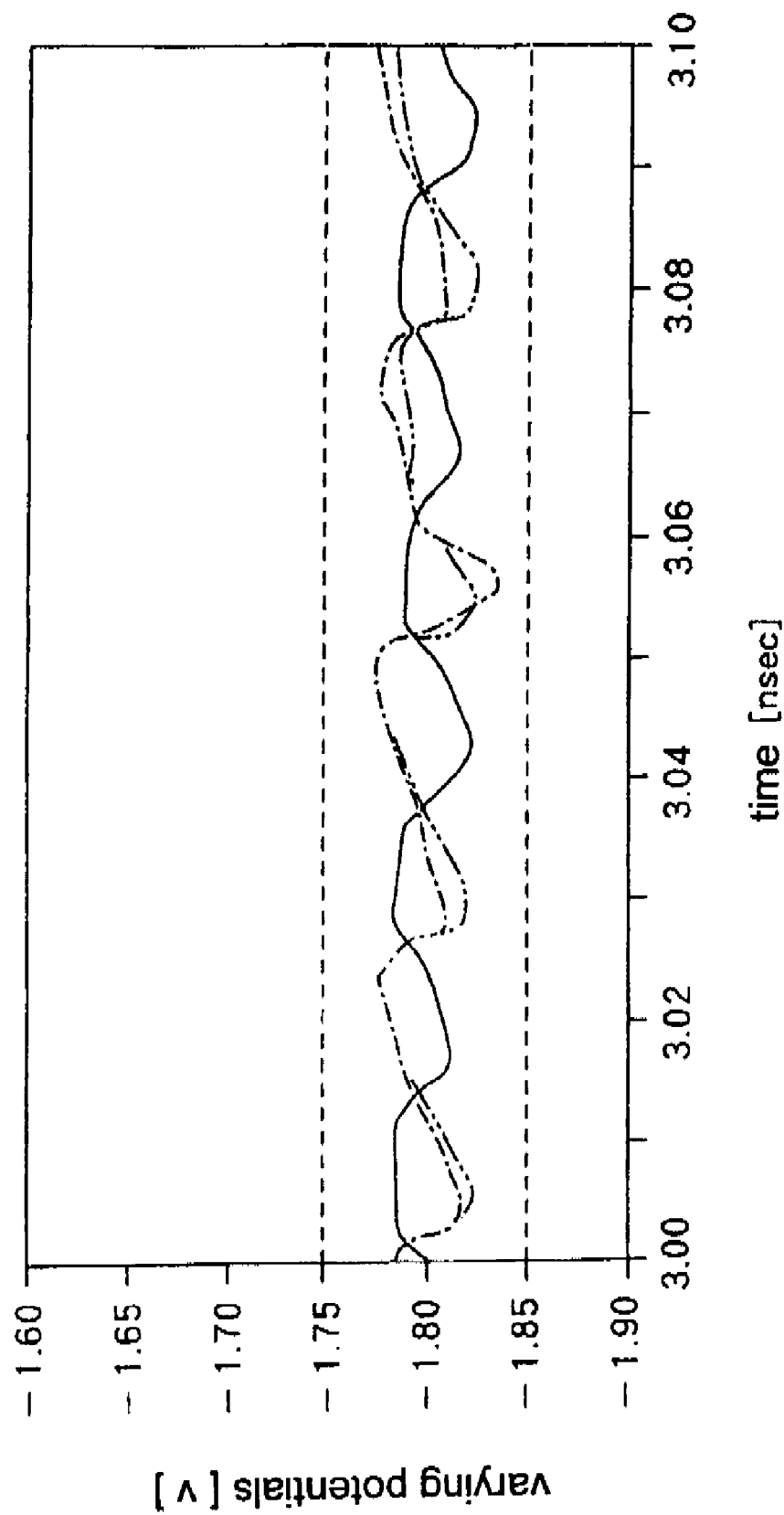
FIG. 17 shows an example of calculated potential variations at common emitter points of data processing differential pairs of the flip-flop circuit according to the third embodiment.

FIG. 17 shows potential variations at common emitter points P1, P2, P3, P4. The vertical axis represents varying potentials and the horizontal axis represents time. The varying potentials at common emitter points P2, P3 are indicated by the solid-line curve. The varying potential at common emitter point P1 is indicated by the dot-and-dash-line curve, and the varying potential at common emitter point P4 by the two-dot-and-dash-line curve. As shown in FIG. 17, at each common emitter point, the potential variation range falls between ±0.05 V across −1.80 V. The potential variation shown in FIG. 17 has its range smaller than the potential variation shown in FIG. 4, and the potential variation ranges between the junctions are uniform.

The flip-flop circuit according to the present invention provides stabler potentials at common emitter points P1, P2, P3, P4 than the conventional flip-flop circuit, with the result that a clock signal interference with the data output waveform is reduced.

The arrangements of the present embodiment are not limited to the latch circuit shown in FIG. 14 and the master-slave flip-flop circuit shown in FIG. 15. An arrangement wherein the latch circuit shown in FIG. 14 is employed as a selector circuit will be described below.

Figure 18:
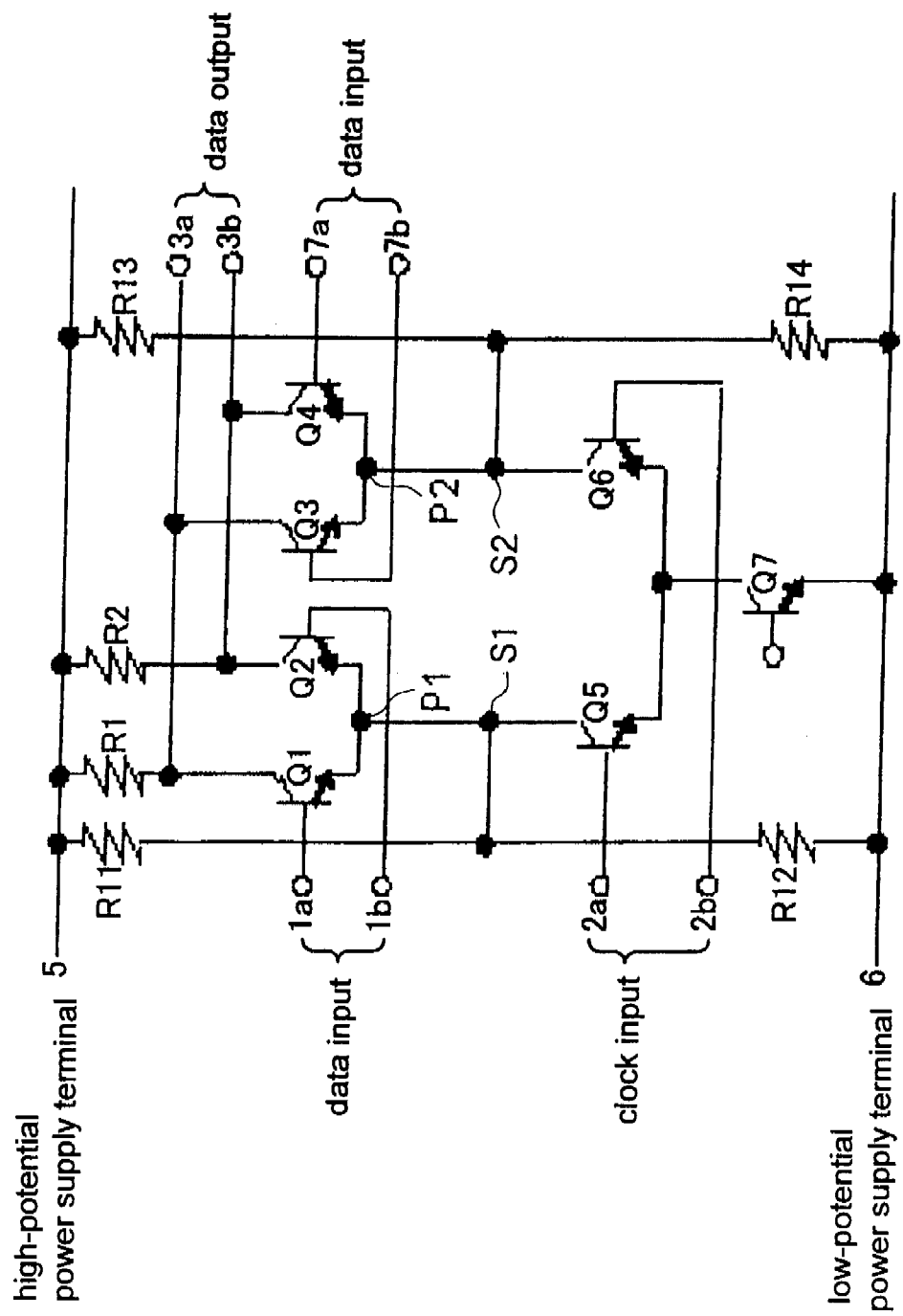
FIG. 18 is a circuit diagram of a selector circuit according to the third embodiment.

FIG. 18 shows a selector circuit employing a data reading circuit which provides the latch circuit shown in FIG. 14. Those parts of the selector circuit which are identical to those of the selector circuit shown in FIG. 7 are denoted by identical reference characters, and will not be described in detail below.

As shown in FIG. 18, the data reading circuit of the selector circuit employs the latch circuit shown in FIG. 14. As with the latch circuit shown in FIG. 14, in the selector circuit, resistors R11, R12 which are connected in series with each other between high-potential power supply terminal 5 and low-potential power supply terminal 6 are divided from each other by junction S1, and resistors R13, R14 which are connected in series with each other between high-potential power supply terminal 5 and low-potential power supply terminal 6 are divided from each other by junction S2.

As described above, the latch circuit shown in FIG. 14 may be applied to a wide range of logic circuits including a flip-flop circuit and a selector circuit.

4th Embodiment

Figure 19:
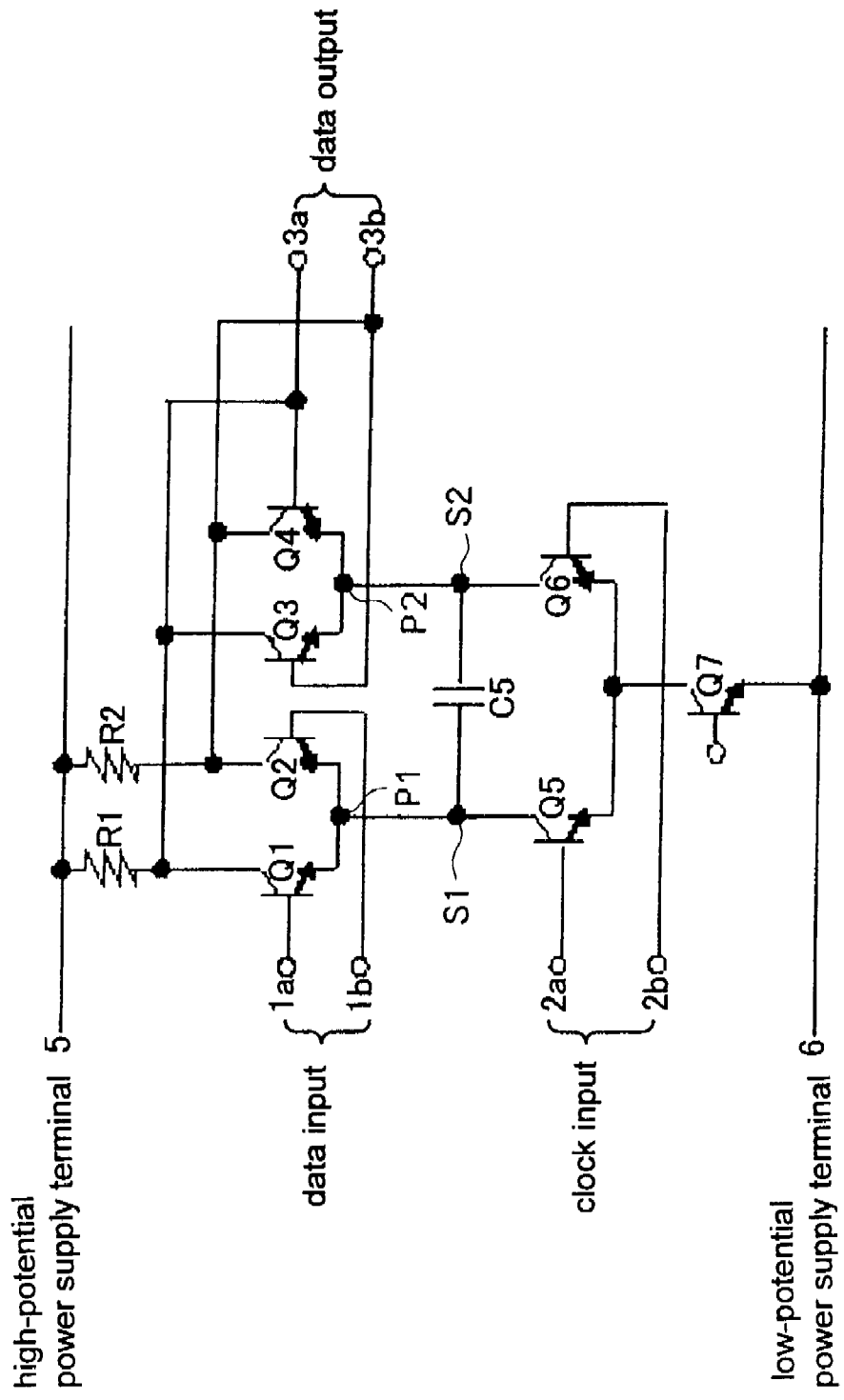
FIG. 19 is a circuit diagram of a latch circuit according to a fourth embodiment.

A latch circuit according to the present embodiment employs a capacitor for potential stabilization. An arrangement of the latch circuit according to the present embodiment will be described below. FIG. 19 is a diagram showing an arrangement of the latch circuit according to the present embodiment. Those parts of the latch circuit which are identical to those of the latch circuit shown in FIG. 5 are denoted by identical reference characters, and will not be described in detail below. The latch circuit shown in FIG. 19 has capacitor C5 connected between junction S1 and junction S2 as the potential stabilizing circuits shown in FIG. 5.

Figure 20:
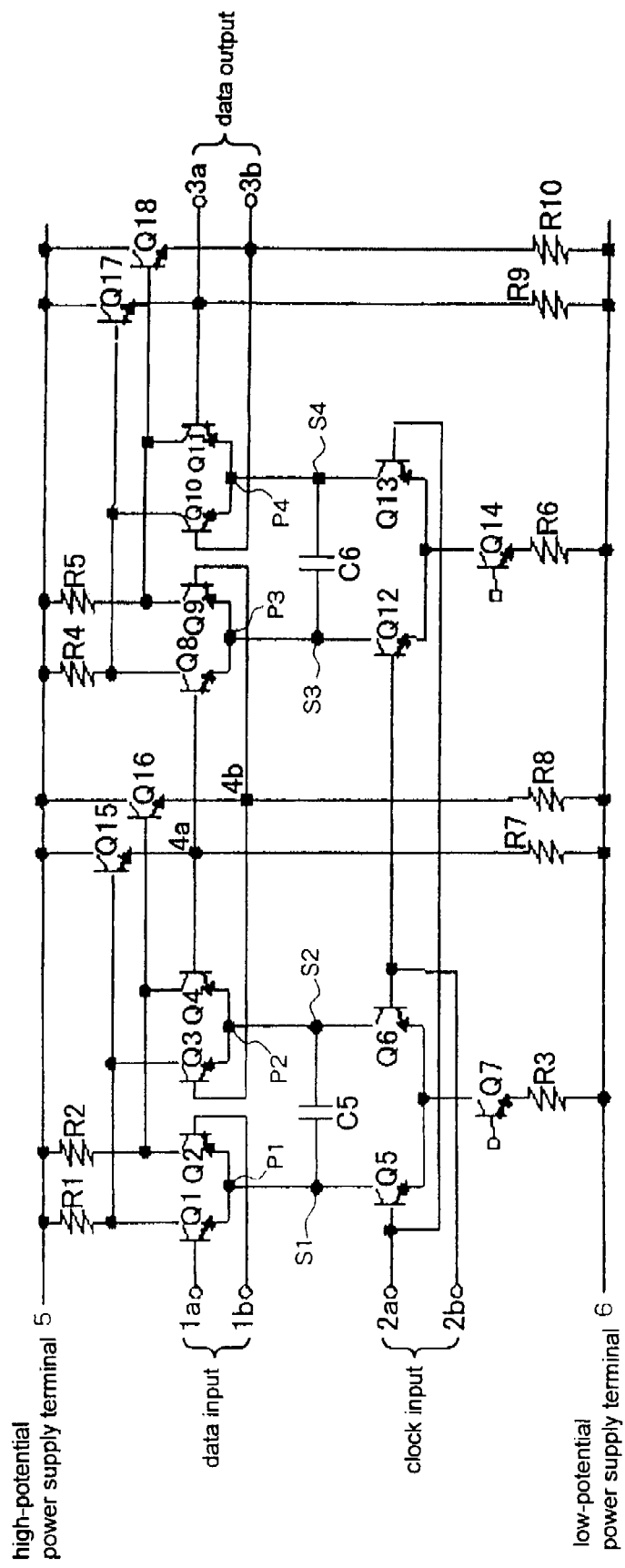
FIG. 20 is a circuit diagram of a flip-flop circuit according to the fourth embodiment.

A master-slave flip-flop circuit employing the latch circuit shown in FIG. 19 will be described below. FIG. 20 is a diagram showing an example of a flip-flop circuit employing the latch circuit shown in FIG. 19. Those parts of the flip-flop circuit which are identical to those of the flip-flop circuit shown in FIG. 6 are denoted by identical reference characters, and will not be described in detail below.

As with the latch circuit shown in FIG. 19, in a master circuit, capacitor C5 is connected between junction S1 and junction S2. In a slave circuit, capacitor C6 is connected between junction S3 and junction S4.

Figure 21:
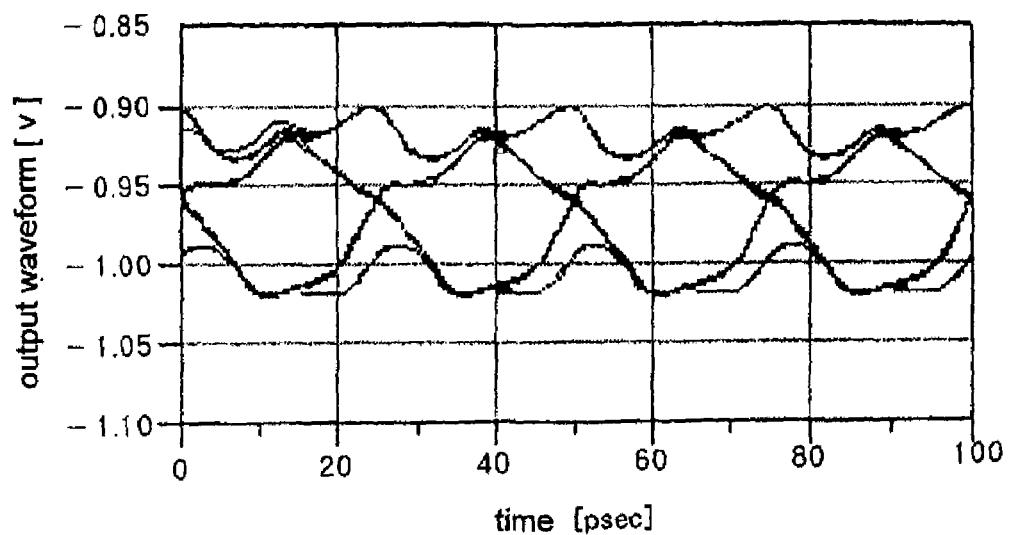
FIG. 21 shows an example of a calculated output waveform of the flip-flop circuit according to the fourth embodiment.

The results of a simulation of the flip-flop circuit shown in FIG. 20 will be described below. FIG. 21 is a graph showing an output waveform calculated by a simulator which is output at points 4a, 4b when a data signal of 40 Gbps is supplied to data input terminals 1a, 1b and a clock signal of 40 GHz is supplied to clock input terminals 2a, 2b. The output data waveform shown in FIG. 21 suffers a less distortion than the waveform shown in FIG. 3.

Figure 22:
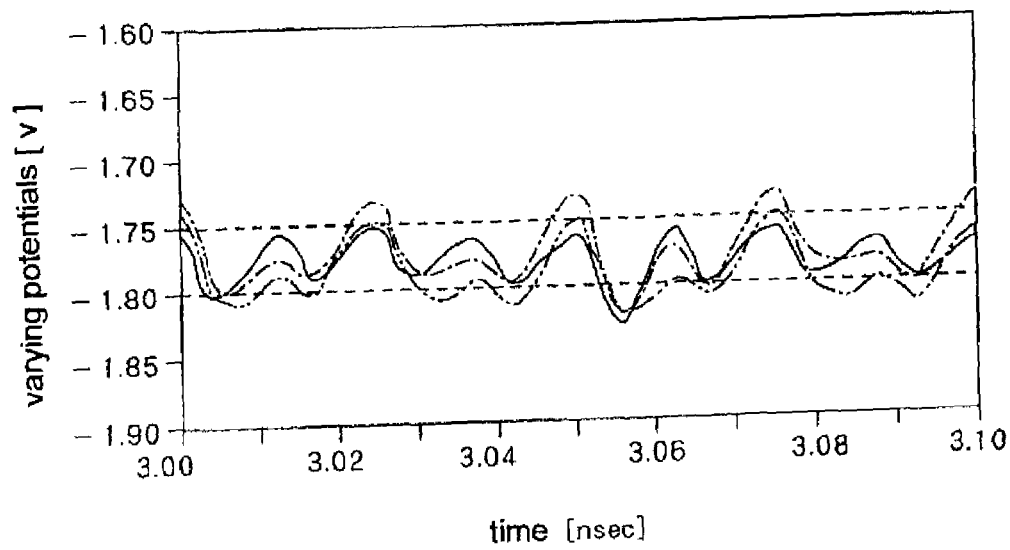
FIG. 22 shows an example of calculated potential variations at common emitter points of data processing differential pairs of the flip-flop circuit according to the fourth embodiment.

FIG. 22 shows potential variations at common emitter points P1, P2, P3, P4. The vertical axis represents varying potentials and the horizontal axis represents time. The varying potentials at common emitter points P2, P3 are indicated by the solid-line curve. The varying potential at common emitter point P1 is indicated by the dot-and-dash-line curve, and the varying potential at common emitter point P4 by the two-dot-and-dash-line curve. As shown in FIG. 22, at common emitter points P1, P4, the potential variation range falls between −1.82 V and −1.73 V, and is mostly 0.05 V though partly 0.09 V. At common emitter points P2, P3, the potential variation range is 0.05 V. The potential variation shown in FIG. 22 at each common emitter point has its range smaller than the potential variation shown in FIG. 4, and the potential variation ranges between the junctions are uniform.

The flip-flop circuit according to the present invention provides stabler potentials at common emitter points P1, P2, P3, P4 than the conventional flip-flop circuit, with the result that a clock signal interference with the data output waveform is reduced.

The arrangements of the present embodiment are not limited to the latch circuit shown in FIG. 19 and the master-slave flip-flop circuit shown in FIG. 20. An arrangement wherein the latch circuit shown in FIG. 19 is employed as a selector circuit will be described below.

Figure 23:
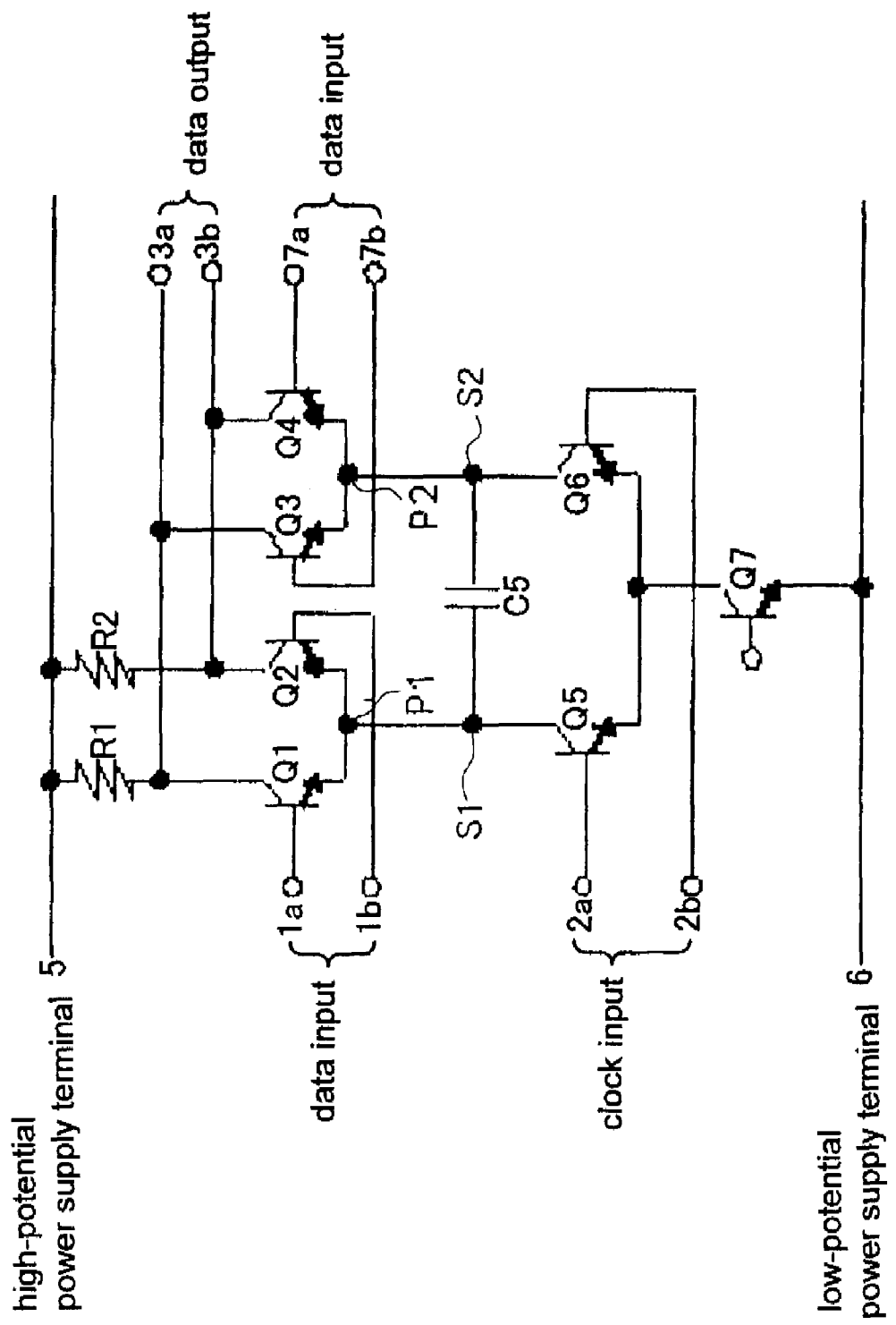
FIG. 23 is a circuit diagram of a selector circuit according to the fourth embodiment.

FIG. 23 shows a selector circuit employing the latch circuit shown in FIG. 19. Those parts of the selector circuit which are identical to those of the selector circuit shown in FIG. 7 are denoted by identical reference characters, and will not be described in detail below.

In the selector circuit shown in FIG. 23, the latch circuit shown in FIG. 19 is employed as a data reading circuit. As with the latch circuit shown in FIG. 19, in the selector circuit, capacitor C5 is connected between junction S1 and junction S2. As described above, the latch circuit shown in FIG. 19 may be applied to a wide range of logic circuits including a selector circuit.

5th Embodiment

Figure 24:
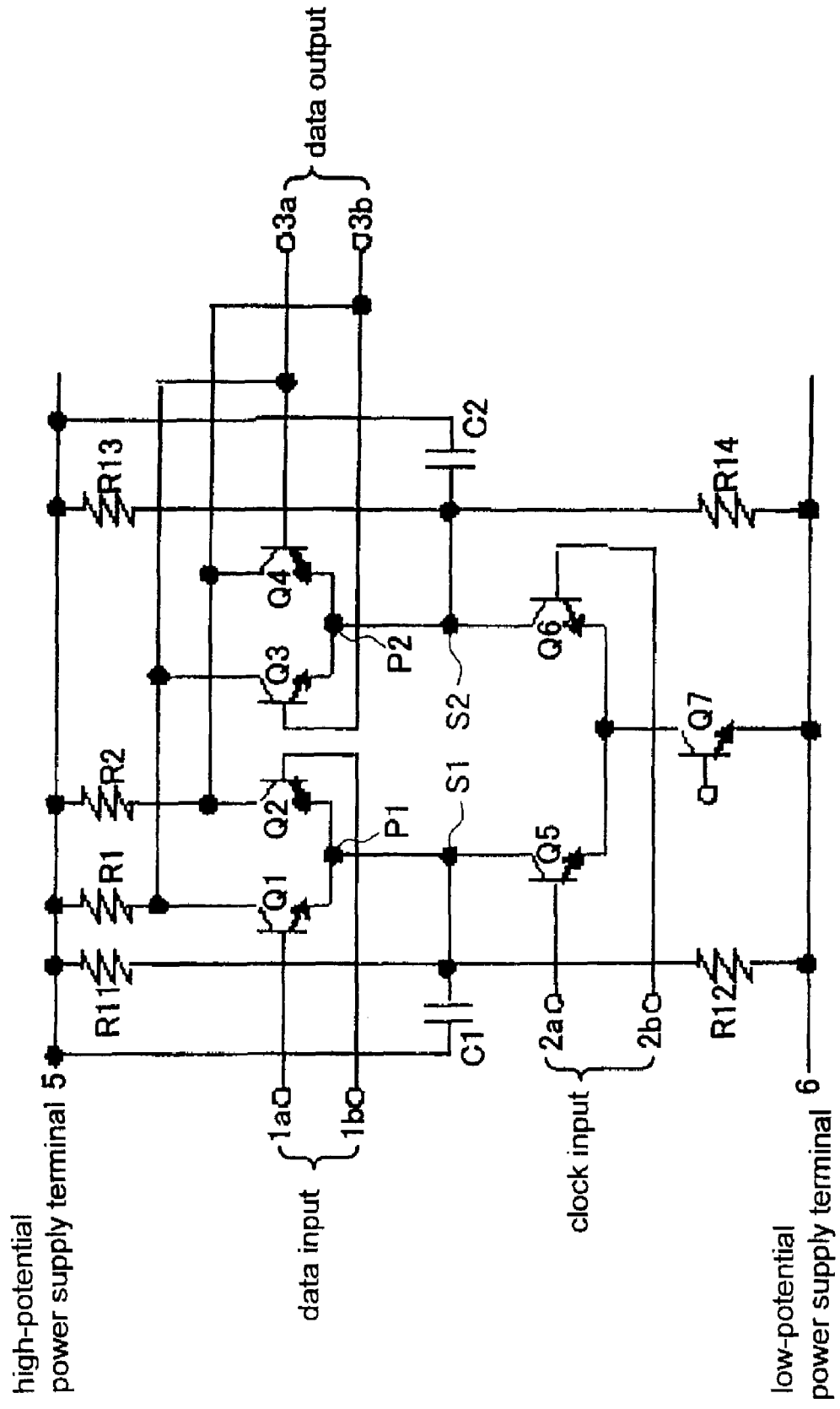
FIG. 24 is a circuit diagram of a latch circuit according to a fifth embodiment.

A latch circuit according to the present embodiment is a combination of the second embodiment and the third embodiment. FIG. 24 is a diagram showing an arrangement of the latch circuit according to the present embodiment. Those parts of the latch circuit which are identical to those of the latch circuits shown in FIGS. 8 and 14 are denoted by identical reference characters, and will not be described in detail below.

As shown in FIG. 24, in the latch circuit, capacitor C1 is connected between junction S1 of the latch circuit shown in FIG. 8 and high-potential power supply terminal 5 and junction S1 divides resistor R11 and resistor R12 which are connected in series with each other between high-potential power supply terminal 5 and low-potential power supply terminal 6. Capacitor C2 is connected between junction S2 and high-potential power supply terminal 5 and junction S2 divides resistor R13 and resistor R14 which are connected in series with each other between high-potential power supply terminal 5 and low-potential power supply terminal 6.

With the arrangement according to the present embodiment, as with the second embodiment and the third embodiment, potential stabilization is achieved at common emitter points P1, P2, thereby improving the data output waveform. The latch circuit according to the present embodiment or a data reading circuit which provides the latch circuit can be used as a basic component circuit of a logic circuit in all semiconductor integrated circuits including a flip-flop circuit and a selector circuit. Combining capacitors and resistors makes it possible to provide a greater variety of layout patterns than possible with employing either capacitors or resistors, resulting in increased freedom for design layouts.

6th Embodiment

Figure 25:
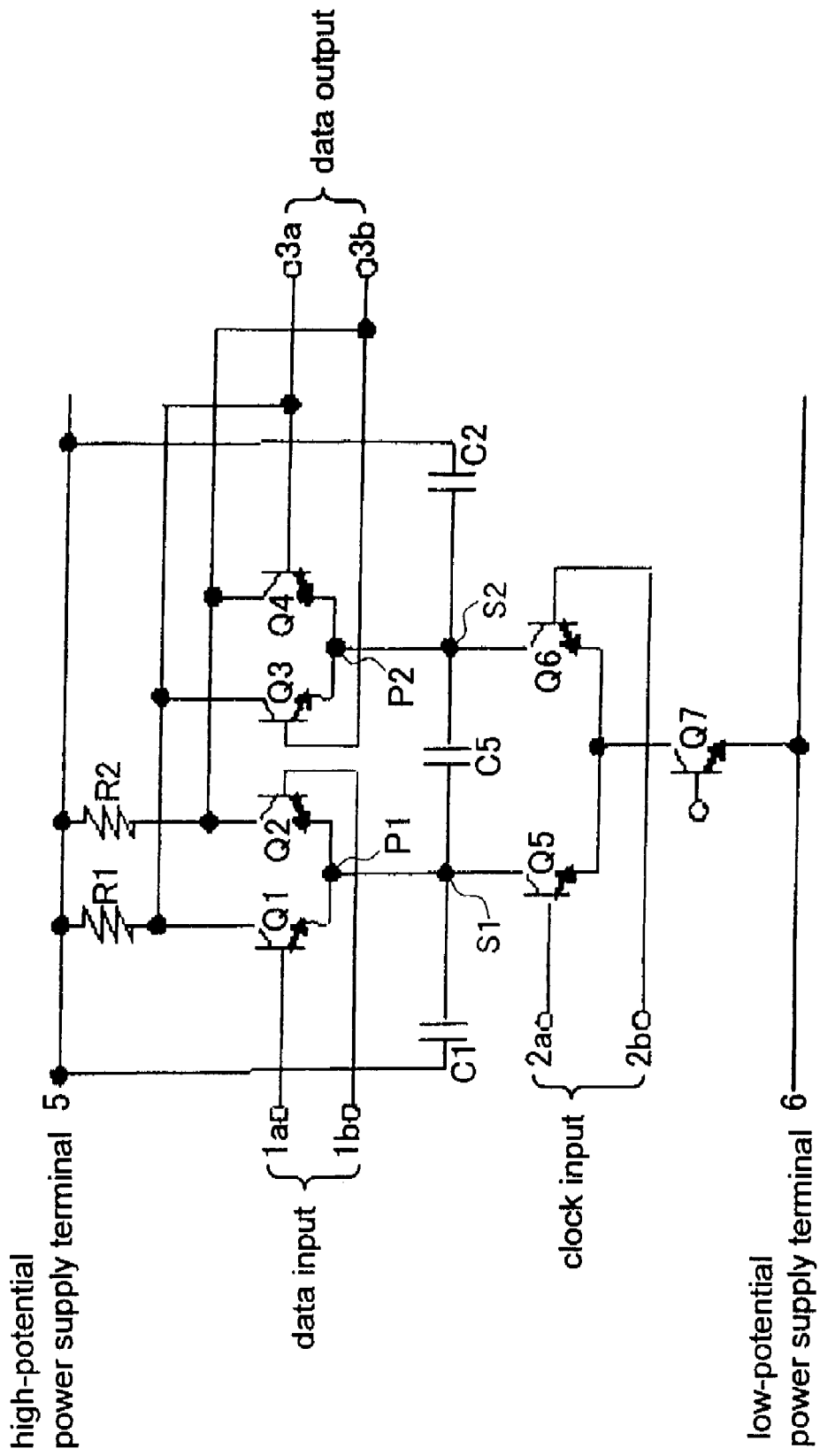
FIG. 25 is a circuit diagram of a latch circuit according to a sixth embodiment.

A latch circuit according to the present embodiment is a combination of the second embodiment and the fourth embodiment. FIG. 25 is a diagram showing an arrangement of the latch circuit according to the present embodiment. Those parts of the latch circuit which are identical to those of the latch circuits shown in FIGS. 8 and 19 are denoted by identical reference characters, and will not be described in detail below.

As shown in FIG. 25, in the latch circuit, capacitor C1 is connected between junction S1 of the latch circuit shown in FIG. 8 and high-potential power supply terminal 5 and capacitor C2 is connected between junction S2 and high-potential power supply terminal 5. Capacitor C5 is connected between junction S1 and junction S2.

With the arrangement according to the present embodiment, as with the second embodiment and the fourth embodiment, potential stabilization is also achieved at common emitter points P1, P2, thereby improving the data output waveform. The latch circuit according to the present embodiment or a data reading circuit which provides the latch circuit can be used as a basic component circuit of a logic circuit in all semiconductor integrated circuits including a flip-flop circuit and a selector circuit. The latch circuit can be designed by combining the capacitance values of capacitor C1, capacitor C2, and capacitor C5, resulting in increased freedom for design layouts.

7th Embodiment

Figure 26:
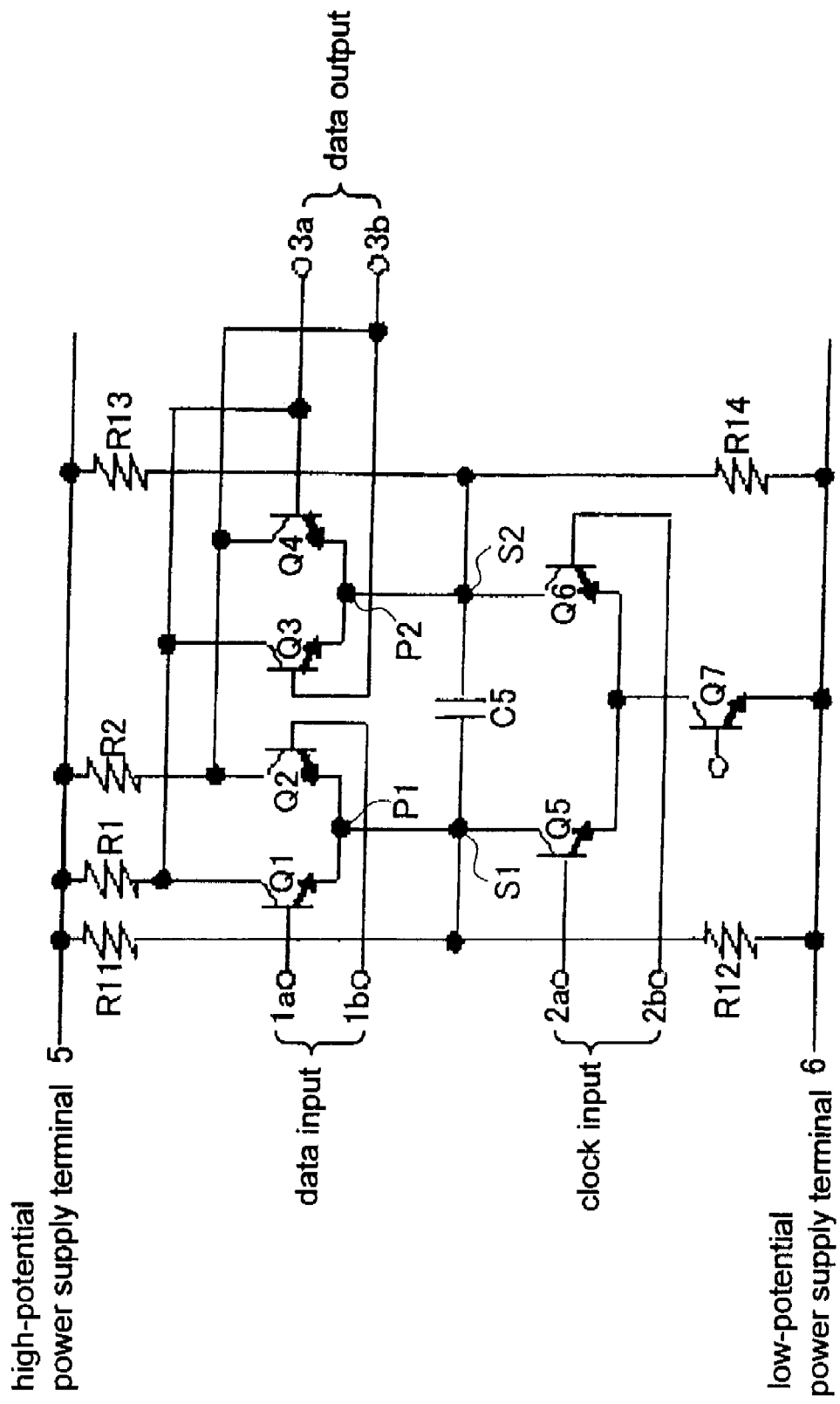
FIG. 26 is a circuit diagram of a latch circuit according to a seventh embodiment.

A latch circuit according to the present embodiment is a combination of the third embodiment and the fourth embodiment. FIG. 26 is a diagram showing an arrangement of the latch circuit according to the present embodiment. Those parts of the latch circuit which are identical to those of the latch circuits shown in FIGS. 14 and 19 are denoted by identical reference characters, and will not be described in detail below.

As shown in FIG. 26, in the latch circuit, junction S1 of the latch circuit shown in FIG. 14 divides resistor R11 and resistor R12 which are connected in series with each other between high-potential power supply terminal 5 and low-potential power supply terminal 6. Junction S2 divides resistor R13 and resistor R14 which are connected in series with each other between high-potential power supply terminal 5 and low-potential power supply terminal 6. Capacitor C5 is connected between junction S1 and junction S2.

With the arrangement according to the present embodiment, as with the third embodiment and the fourth embodiment, potential stabilization is also achieved at common emitter points P1, P2, thereby improving the data output waveform. The latch circuit according to the present embodiment or a data reading circuit which provides the latch circuit can be used as a basic component circuit of a logic circuit in all semiconductor integrated circuits including a flip-flop circuit and a selector circuit. Combining capacitors and resistors makes it possible to provide a greater variety of layout patterns than possible with employing either capacitors or resistors, resulting in increased freedom for design layouts.

8th Embodiment

Figure 27:
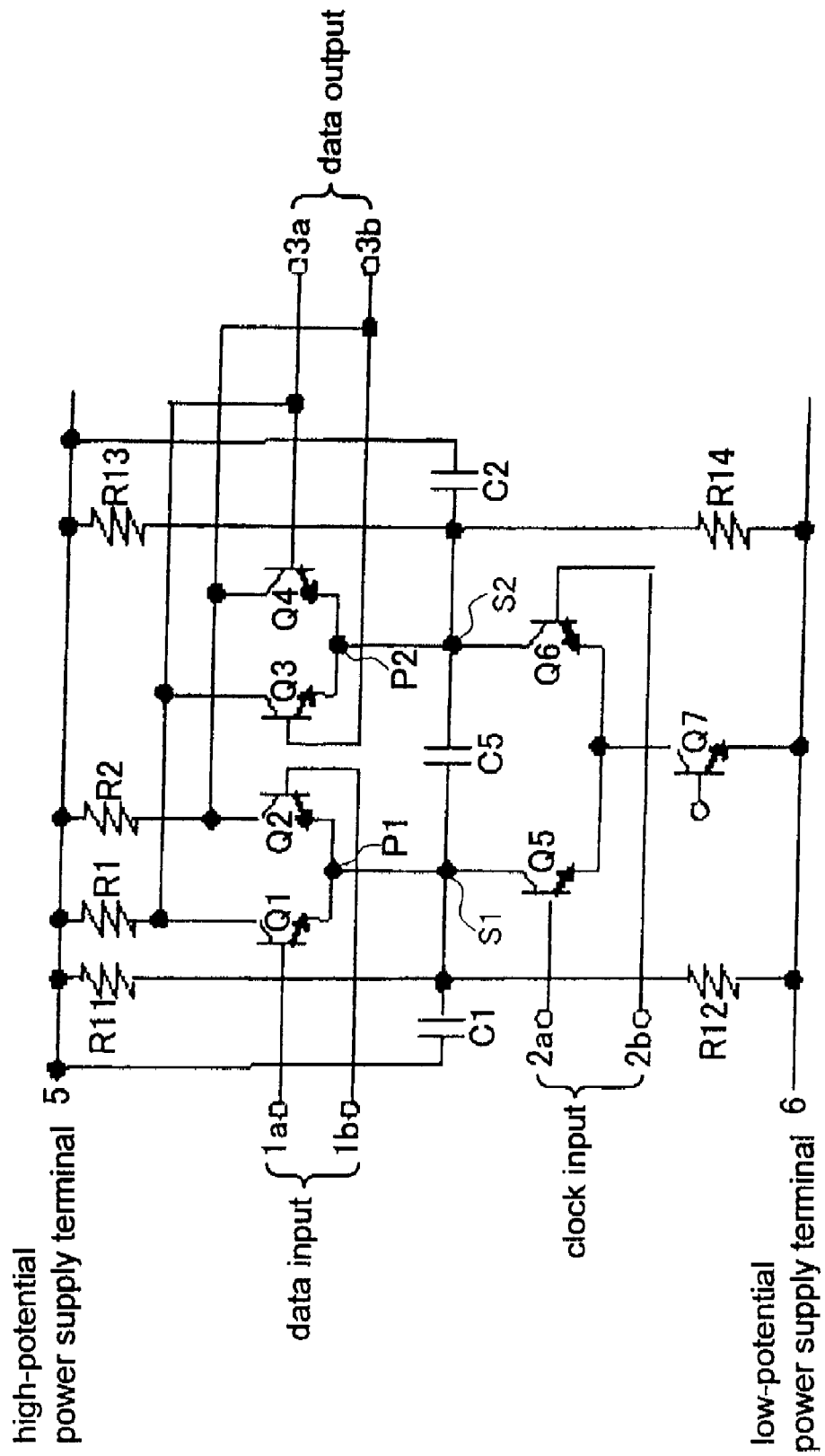
FIG. 27 is a circuit diagram of a latch circuit according to an eighth embodiment.

A latch circuit according to the present embodiment is a combination of the second embodiment, the third embodiment, and the fourth embodiment. FIG. 27 is a diagram showing an arrangement of the latch circuit according to the present embodiment. Those parts of the latch circuit which are identical to those of the latch circuits shown in FIGS. 8, 14, and 19 are denoted by identical reference characters, and will not be described in detail below. As shown in FIG. 27, the latch circuit has capacitor C5 connected between junction S1 and junction S2 of the latch circuit shown in FIG. 24.

With the arrangement according to the present embodiment, as with the second embodiment, the third embodiment, and the fourth embodiment, potential stabilization is also achieved at common emitter points P1, P2, thereby improving the data output waveform. The latch circuit according to the present embodiment or a data reading circuit which provides the latch circuit can be used as a basic component circuit of a logic circuit in all semiconductor integrated circuits including a flip-flop circuit and a selector circuit. Not only combining the capacitance values of capacitor C1, capacitor C2, and capacitor C5, but also combining capacitors and resistors makes it possible to provide a greater variety of layout patterns than possible with employing either capacitors or resistors, resulting in increased freedom for design layouts.

9th Embodiment

Figure 28:
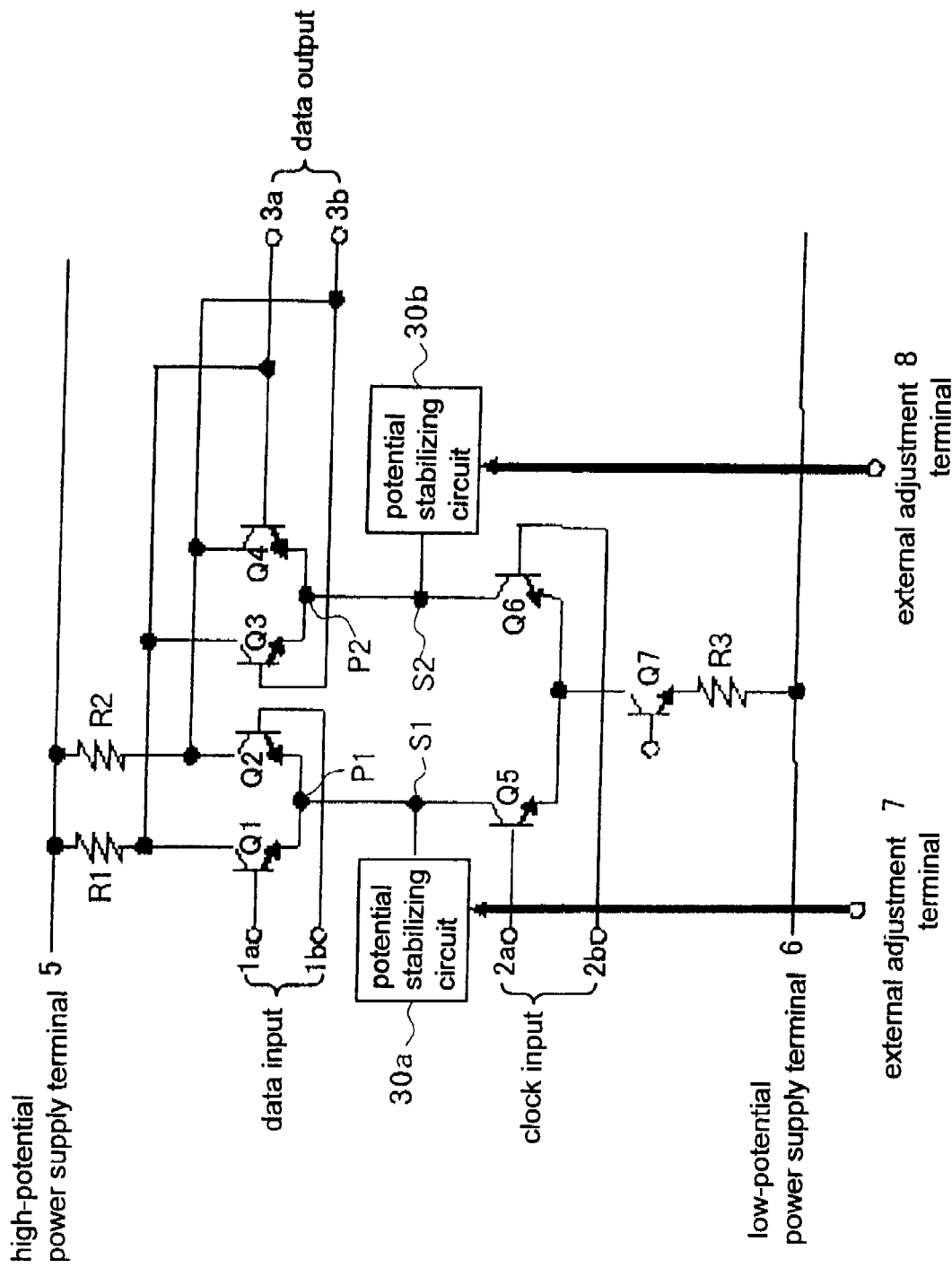
FIG. 28 is a circuit diagram of a latch circuit according to a ninth embodiment.

A latch circuit according to the present embodiment is arranged to allow potential stabilizing circuits 30a, 30b in the latch circuit according to the first embodiment to be adjusted from outside of the latch circuit. FIG. 28 is a diagram showing an arrangement of the latch circuit according to the present embodiment. Those parts of the latch circuit which are identical to those of the latch circuit shown in FIG. 5 are denoted by identical reference characters, and will not be described in detail below.

As shown in FIG. 28, the latch circuit has external adjustment terminals connected to potential stabilizing circuits 30a, 30b in the latch circuit shown in FIG. 5. Potential stabilizing circuits 30a, 30b have their circuit parameters adjustable by voltages or currents input via the external adjustment terminals.

In the latch circuit according to the present invention, potential variations produced at common emitter terminals P1, P2 in synchronism with the clock signal are reduced by the respective potential stabilizing circuits. As a result, the latch circuit offers the same advantages as the first embodiment in that noise caused by the clock signal is prevented from being superposed on the input potentials supplied to the first differential pair and the second differential pair, making it possible for the latch circuit to produce an output waveform free of a clock signal interference. The circuit parameters of the potential stabilizing circuits are adjusted by the values of voltages or currents input to the external adjustment terminals for thereby controlling a clock signal interference reduction to obtain a desired output data waveform.

The present invention is not limited to the latch circuit shown in FIG. 28, but is applicable to a functional circuit such as a flip-flop circuit constructed using the present latch circuit. The present invention is also applicable to a wide range of logic circuits such as a selector circuit constructed using a data reading circuit which provides the present latch circuit.

10th Embodiment

Figure 29:
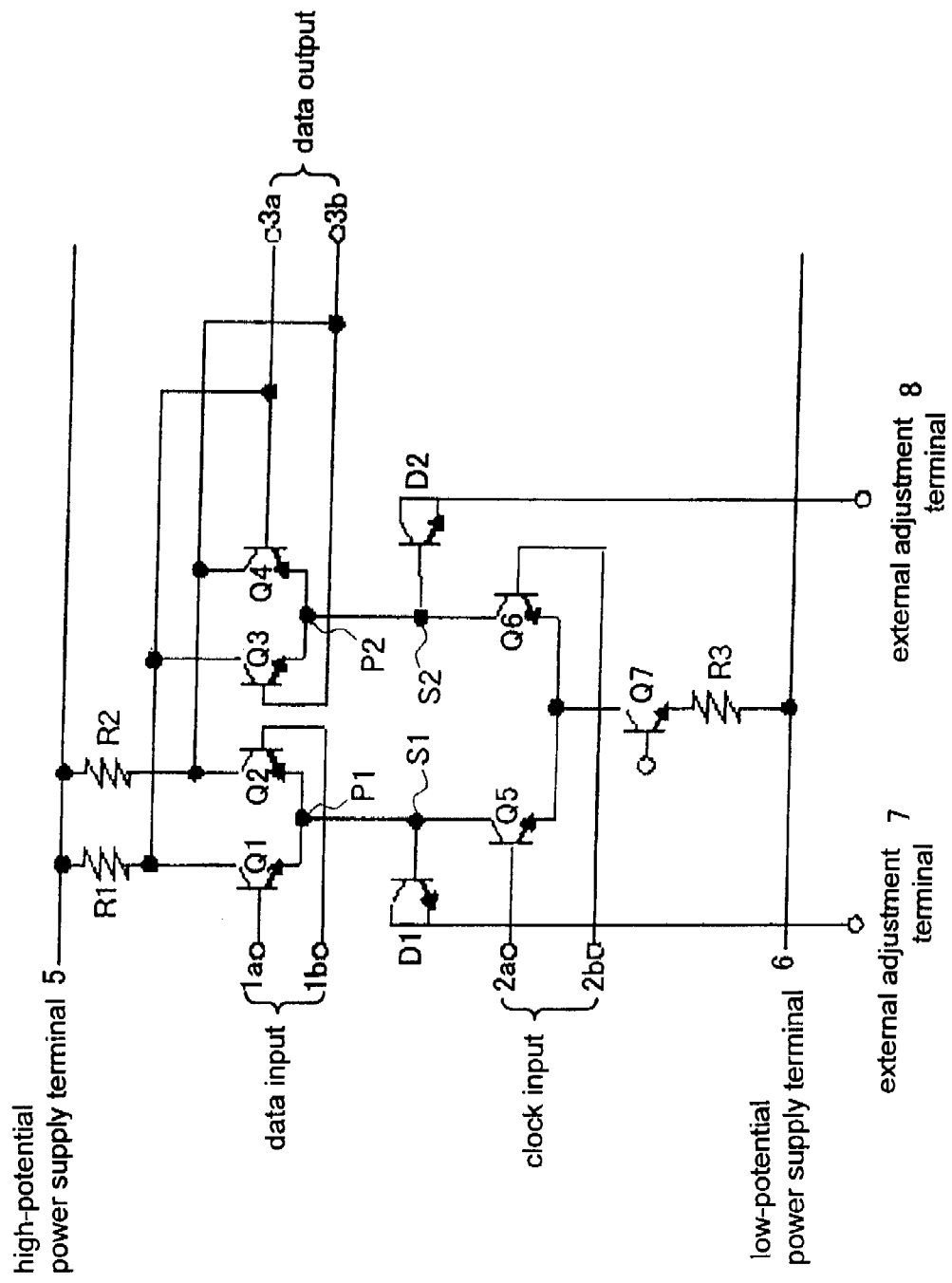
FIG. 29 is a circuit diagram of a latch circuit according to a tenth embodiment.

A latch circuit according to the present embodiment has variable-capacitance diodes as the potential stabilizing circuits in the latch circuit according to the first embodiment. FIG. 29 is a diagram showing an arrangement of the latch circuit according to the present embodiment. Those parts of the latch circuit which are identical to those of the latch circuit shown in FIG. 5 are denoted by identical reference characters, and will not be described in detail below.

As shown in FIG. 29, the latch circuit according to the present embodiment has varactor diode D1, whose capacitance is variable, connected to junction S1 as the potential stabilizing circuit shown in FIG. 28, and varactor diode D2 connected to junction S2. External adjustment terminals 7, 8 are connected respectively to varactor diodes D1, D2. If an output waveform from data output terminals 3a, 3b is abnormal, then potential levels input to external adjustment terminals 7, 8 are adjusted to change the capacitance values of varactor diodes D1, D2. The circuit parameters are provided as the capacitance values of varactor diodes D1, D2.

When the voltage values input to external adjustment terminals 7, 8 are adjusted, the capacitance values of varactor diodes D1, D2 are controlled to control a clock signal interference reduction. According to the present invention, therefore, even after the circuit chip is fabricated, the output data waveform can be improved into a desired shape by adjusting the potential levels input to external adjustment terminals 7, 8 while monitoring the output data waveform.

The present invention is not limited to the latch circuit shown in FIG. 29, but is applicable to a functional circuit such as a flip-flop circuit constructed using the present latch circuit. The present invention is also applicable to a wide range of logic circuits such as a selector circuit constructed using a data reading circuit which provides the present latch circuit.

11th Embodiment

Figure 30:
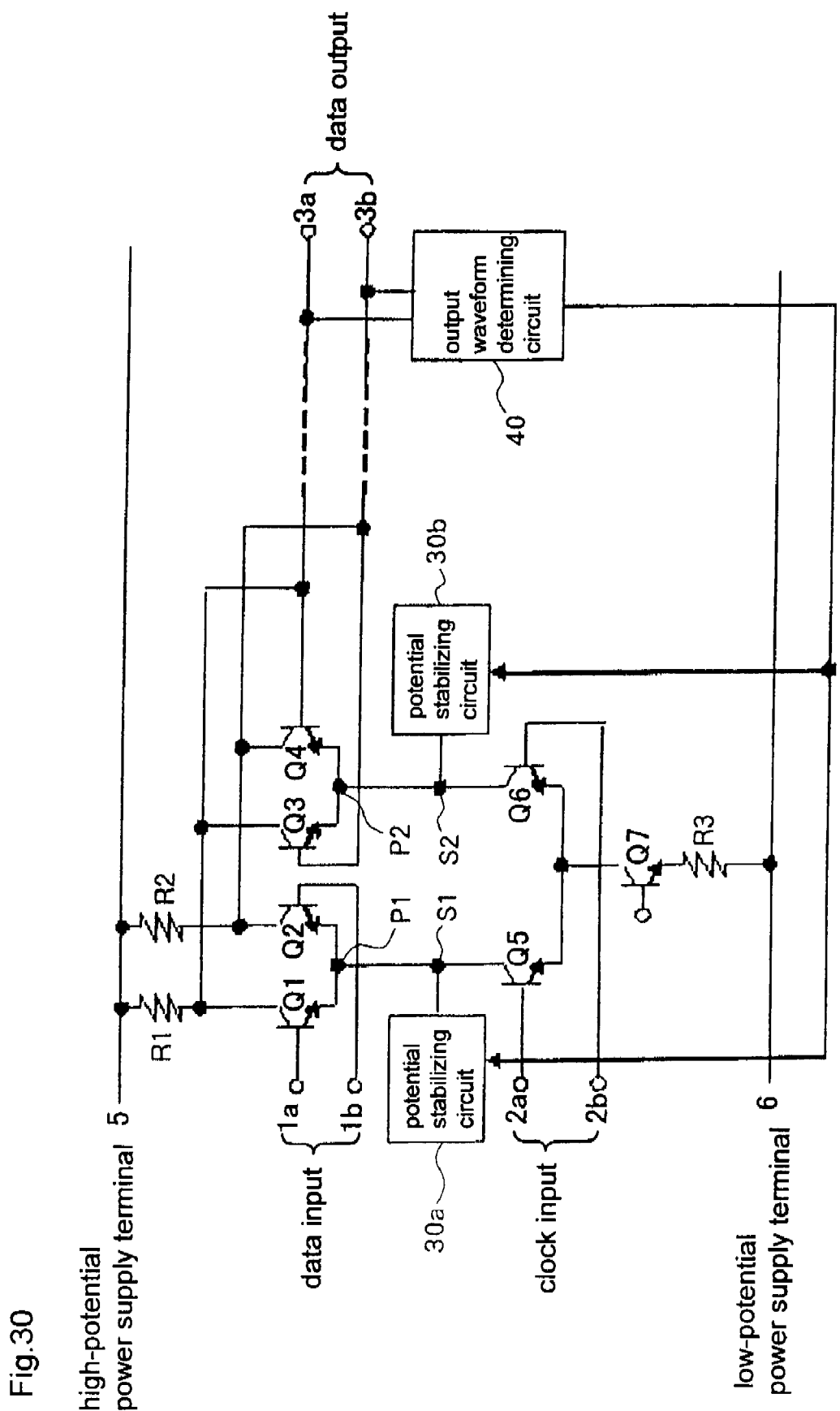
FIG. 30 is a circuit diagram of a latch circuit according to an eleventh embodiment.

A latch circuit according to the present embodiment includes an output waveform determining circuit for feeding back output waveform information to the potential stabilizing circuits in the latch circuit according to the first embodiment. FIG. 30 is a diagram showing an arrangement of the latch circuit according to the present embodiment. Those parts of the latch circuit which are identical to those of the latch circuit shown in FIG. 5 are denoted by identical reference characters, and will not be described in detail below.

As shown in FIG. 30, the latch circuit has output waveform determining circuit 40 connected to potential stabilizing circuits 30a, 30b of the latch circuit shown in FIG. 5. Output waveform determining circuit 40 is connected to data output terminals 3a, 3b. Output waveform determining circuit 40 determines whether or not an output waveform received from data output terminals 3a, 3b is of a value equal to or greater than a predetermined threshold voltage due to jitter or the like, and transmits an output data signal including information as to the determined result to potential stabilizing circuits 30a, 30b. When potential stabilizing circuits 30a, 30b receives the output data signal, they adjust the circuit parameters depending on the information as to the determined result included in the output data signal.

In the latch circuit according to the present invention, potential variations produced at common emitter terminals P1, P2 in synchronism with the clock signal are reduced by the respective potential stabilizing circuits. As a result, the latch circuit offers the same advantages as the first embodiment in that noise caused by the clock signal is prevented from being superposed on the input potentials supplied to the first differential pair and the second differential pair, making it possible for the latch circuit to produce an output waveform free of a clock signal interference. When the information received from the data output terminals 3a, 3b by the output waveform determining circuit 40 is fed back to the potential stabilizing circuits, the circuit parameters of the potential stabilizing circuits are adjusted for thereby controlling a clock signal interference reduction to obtain a desired output data waveform.

The present invention is not limited to the latch circuit shown in FIG. 30, but is applicable to a functional circuit such as a flip-flop circuit constructed using the present latch circuit. The present invention is also applicable to a wide range of logic circuits such as a selector circuit constructed using a data reading circuit which provides the present latch circuit.

12th Embodiment

Figure 31:
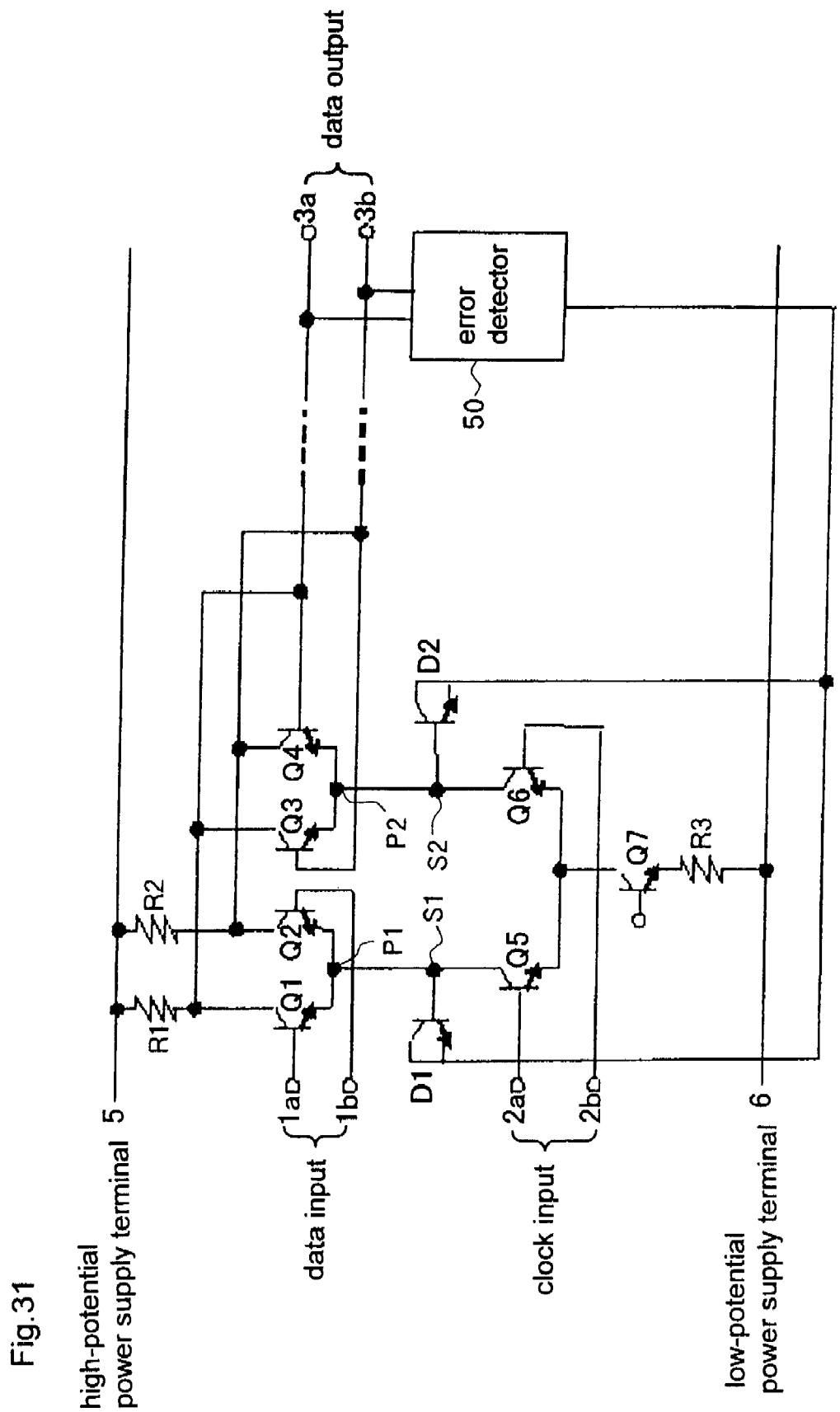
FIG. 31 is a circuit diagram of a latch circuit according to a twelfth embodiment.

A latch circuit according to the present embodiment includes an error detector for feeding back error information to the varactor diodes of the latch circuit according to the tenth embodiment. FIG. 31 is a diagram showing an arrangement of the latch circuit according to the present embodiment. Those parts of the latch circuit which are identical to those of the latch circuit shown in FIG. 29 are denoted by identical reference characters, and will not be described in detail below.

As shown in FIG. 31, the latch circuit has error detector 50 connected to varactor diodes D1, D2 of the latch circuit shown in FIG. 29. Error detector 50 is connected to data output terminals 3a, 3b. Error detector 50 determines whether an output waveform received from data output terminals 3a, 3b exceeds a predetermined threshold voltage or not. If the output waveform is smaller than the threshold voltage, then error detector 50 maintains the voltage value output to varactor diodes D1, D2. If error detector 50 detects a portion of the output waveform which is equal to or greater than the threshold voltage due to jitter or the like, error detector 50 changes the voltage value output to varactor diodes D1, D2 by a predetermined quantity. Varactor diodes D1, D2 change their capacitance value depending on the voltage value input from error detector 50.

When the capacitance value of varactor diodes D1, D2 is increased, the potential variation range at common emitter points P1, P2 of the latch circuit is reduced. If varactor diodes D1, D2 are to increase their capacitance value as the voltage value input from error detector 50 is greater, then varactor diodes D1, D2 operate as follows: When error detector 50 detects a portion of the output waveform which is equal to or greater than the threshold voltage, error detector 50 increases the voltage output to varactor diodes D1, D2 by a predetermined quantity. Varactor diodes D1, D2 change their capacitance value depending on the voltage value input from error detector 50.

Figure 32:
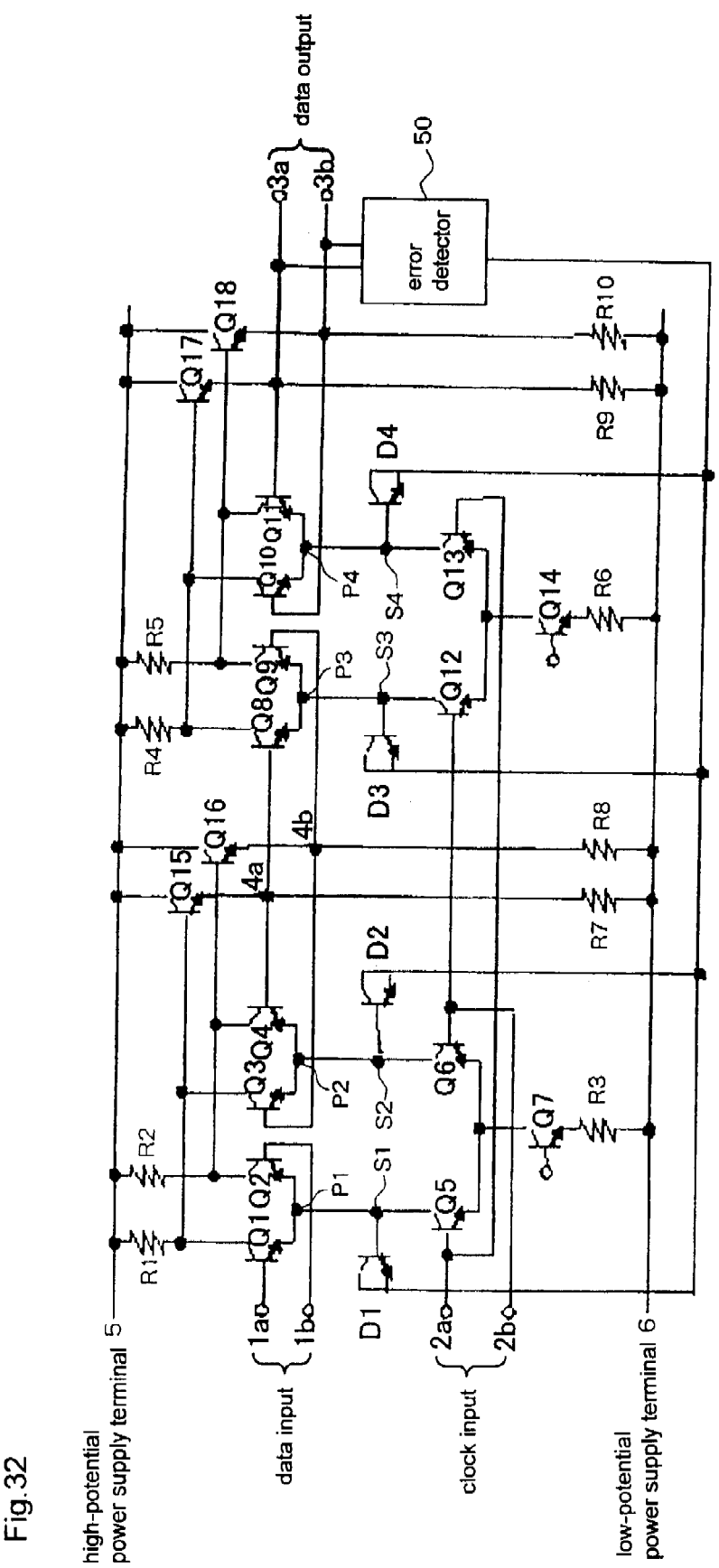
FIG. 32 is a circuit diagram of a flip-flop circuit according to the twelfth embodiment.

A master-slave flip-flop circuit employing the latch circuit shown in FIG. 31 will be described below. FIG. 32 is a diagram showing an example of a flip-flop circuit employing the latch circuit shown in FIG. 31. Those parts of the flip-flop circuit which are identical to those of the flip-flop circuit shown in FIG. 6 are denoted by identical reference characters, and will not be described in detail below.

As shown in FIG. 32, as with the latch circuit shown in FIG. 31, in a master circuit, varactor diodes D1, D2 are connected to error detector 50. In a slave circuit, varactor diode D3 is connected to junction S3, and varactor diode D4 is connected to junction S4. Varactor diodes D3, D4 are connected to error detector 50.

According to the present embodiment, the capacitance of the varactor diodes is adjusted depending on the amount of error detected by error detecting circuit 50 to adjust an output waveform to a desired shape for thereby controlling a clock signal interference reduction.

The arrangement of the present embodiment is not limited to the latch circuit shown in FIG. 31 and the master-slave flip-flop circuit shown in FIG. 32. However, the arrangement of the present embodiment is applicable to a wide range of logic circuits including a clocked inverter flip-flop circuit and a selector circuit constructed using a data reading circuit which provides the present latch circuit.

According to the present invention, as described above, in a latch circuit and a data reading circuit which provides the latch circuit, the potential at the common emitter of the differential transistor pair for processing a data signal is stabilized, thereby providing a high-speed logic circuit with an improved error rate for suppressing a distortion (clock signal interference) of the output waveform which is produced in synchronism with the clock signal. A flip-flop circuit employing those circuits also offers the same advantages.

The circuit parameter of the potential stabilizing circuit connected to the common emitter is variable and its value is adjusted to control a clock signal interference reduction. In this manner, the performance of the logic circuit is optimized. Even if the performance of active components and passive components in the circuit varies due to process variations and aging, they can be controlled to obtain a desired output waveform, making it effective to increase a yield of circuits and the reliability thereof.

The embodiments of the present invention have been described on the assumption that bipolar transistors are used as active components. However, the present invention is not limited to any types of active components, but is also applicable to FET components such as HEMTs (High Electron Mobility Transistors) and MOSFETs.

The present invention is not limited to the above embodiments, but various modifications may be made within the scope of the present invention as falling within the scope of the invention.

The invention claimed is:

1. A logic circuit comprising:
    a first differential transistor pair operable in response to a data signal input thereto;
    a current source for supplying a current to said first differential transistor pair;
    a first transistor connected between a common emitter of said first differential transistor pair and said current source, and operable in response to a clock signal input thereto; and
    a first potential stabilizing circuit connected to a first junction between the common emitter of said first differential transistor pair and a collector of said first transistor, for stabilizing a potential at said first junction;
    wherein said first potential stabilizing circuit has a capacitor connected between said first junction and a power supply potential, wherein the power supply potential is not a ground potential, and
    wherein said capacitor is directly connected to said power supply potential.

2. The logic circuit according to claim 1, wherein said first transistor has a collector resistance Rc and a collector-to-ground capacitance Cc, and wherein said capacitor has a capacitance value C in a range of $0.1 \cdot C0 < C < 10 \cdot C0$, where C0 is expressed as $C0 = 1/(2\pi fc \cdot Rc) - Cc$.

3. The logic circuit according to claim 1, wherein at least either said first differential transistor pair or said first transistor comprises an FET component.

4. A logic circuit comprising:
    a first differential transistor pair operable in response to a data signal input thereto;
    a current source for supplying a current to said first differential transistor pair;
    a first transistor connected between a common emitter of said first differential transistor pair and said current source, and operable in response to a clock signal input thereto;
    a first potential stabilizing circuit connected to a first junction between the common emitter of said first differential transistor pair and a collector of said first transistor, for stabilizing a potential at said first junction;
    a second differential transistor pair operable in response to a data signal input thereto;
    a second transistor connected between a common emitter of said second differential transistor pair and said current source, and connected to an inverted signal of said clock signal; and
    a second potential stabilizing circuit connected to a second junction between the common emitter of said second differential transistor pair and a collector of said second transistor, for stabilizing a potential at said second junction;

wherein said second potential stabilizing circuit has a capacitor connected between said second junction and a power supply potential, wherein the power supply potential is not a ground potential, and wherein said capacitor is directly connected to said power supply potential.

5. The logic circuit according to claim 4, wherein at least either one of said first differential transistor pair, said second differential transistor pair, said first transistor, or said second transistor comprises an FET component.

6. A logic circuit comprising:

a first differential transistor pair operable in response to a data signal input thereto;

a current source for supplying a current to said first differential transistor pair;

a first transistor connected between a common emitter of said first differential transistor pair and said current source, and operable in response to a clock signal input thereto;

a first potential stabilizing circuit connected to a first junction between the common emitter of said first differential transistor pair and a collector of said first transistor, for stabilizing a potential at said first junction;

a second differential transistor pair operable in response to a data signal input thereto;

a second transistor connected between a common emitter of said second differential transistor pair and said current source, and operable in response to an inverted signal of said clock signal; and a second potential stabilizing circuit connected to a second junction between the common emitter of said second differential transistor pair and a collector of said second transistor, for stabilizing a potential at said second junction;

wherein said first potential stabilizing circuit and said second potential stabilizing circuit have respective capacitors connected between said first junction and said second junction.

7. The logic circuit according to claim 6, wherein at least either one of said first differential transistor pair, said second differential transistor pair, said first transistor, or said second transistor comprises an FET component.

* * * * *